(12) United States Patent
Masleid

(10) Patent No.: US 7,642,866 B1
(45) Date of Patent: Jan. 5, 2010

(54) CIRCUITS, SYSTEMS AND METHODS RELATING TO A DYNAMIC DUAL DOMINO RING OSCILLATOR

(76) Inventor: Robert Masleid, 17266 Eaton La., Monte Sereno, CA (US) 95930

( * ) Notice: Subject to any disclaimer, the term of this patent is extended or adjusted under 35 U.S.C. 154(b) by 67 days.

(21) Appl. No.: 11/322,896

(22) Filed: Dec. 30, 2005

(51) Int. Cl.
*H03K 3/03* (2006.01)
*H03H 11/26* (2006.01)

(52) U.S. Cl. .......................... 331/57; 327/264; 327/284
(58) Field of Classification Search .................. 331/57, 331/44, 108 A, 108 C, 108 D; 327/261, 263, 327/264, 284, 285
See application file for complete search history.

(56) References Cited

U.S. PATENT DOCUMENTS

| | | | |
|---|---|---|---|
| 3,991,380 A | 11/1976 | Pryor | |
| 4,498,021 A | 2/1985 | Uya | |
| 4,739,252 A | 4/1988 | Malaviya et al. | |
| 5,128,560 A | 7/1992 | Chern et al. | |
| 5,166,555 A | 11/1992 | Kano | |
| 5,264,738 A | 11/1993 | Veendrick et al. | |
| 5,297,086 A | 3/1994 | Nasu et al. | |
| 5,410,278 A | 4/1995 | Itoh et al. | |
| 5,414,312 A | 5/1995 | Wong | |
| 5,416,861 A | 5/1995 | Koh et al. | |
| 5,455,521 A | 10/1995 | Dobbelaere | |
| 5,467,038 A | 11/1995 | Motley et al. | |
| 5,497,105 A | 3/1996 | Oh et al. | |
| 5,525,616 A | 6/1996 | Platt et al. | |
| 5,568,103 A | 10/1996 | Nakashima et al. | |
| 5,594,360 A | 1/1997 | Wojciechowski | |
| 5,677,650 A | 10/1997 | Kwasniewski et al. | |
| 5,680,359 A | 10/1997 | Jeong | |
| 5,698,774 A | 12/1997 | Osmanski | |
| 5,698,994 A | 12/1997 | Tsuji | |
| 5,764,110 A | 6/1998 | Ishibashi | |
| 5,767,700 A | 6/1998 | Lee | |
| 5,791,715 A | 8/1998 | Nebel | |
| 5,793,715 A | 8/1998 | Alon et al. | |
| 5,796,313 A | 8/1998 | Eitan | |
| 5,811,983 A | 9/1998 | Lundberg | |
| 5,880,608 A | 3/1999 | Mehta et al. | |
| 5,963,043 A | 10/1999 | Nassif | |
| 5,963,074 A | 10/1999 | Arkin | |

(Continued)

FOREIGN PATENT DOCUMENTS

EP 1398639 3/2004

(Continued)

OTHER PUBLICATIONS

Chen, G. et al., "Dynamic NBTI of p-MOS Transistors and its Impact on MOSFET Scaling", IEEE Electron Device Letters, 2002.

(Continued)

*Primary Examiner*—Robert Pascal
*Assistant Examiner*—Ryan J. Johnson

(57) ABSTRACT

A dynamic dual domino oscillating ring circuit is described, which has multiple non-inverting dual domino circuits, each having a signal input, N and P-domino triggers, precharge and pre-discharge, N and P-domino cutoffs and an output inverter. A number of the dual domino circuits are coupled in series, the output of one feeding the input of the next, to form a dual domino chain, which form stages of the dual domino ring. A number of the stages are coupled in series, the output of one feeding the input of the next, to form the ring. The first dual domino circuit of the chain receives a signal input and the N and P triggers for the chain. Within the ring, the output of each stage feeds the input signal to the next stage and is fed back to clock an earlier stage to allow the ring to oscillate.

28 Claims, 28 Drawing Sheets

U.S. PATENT DOCUMENTS

| | | | |
|---|---|---|---|
| 5,969,543 A | 10/1999 | Erickson et al. | |
| 5,977,763 A | 11/1999 | Loughmiller et al. | |
| 5,982,211 A | 11/1999 | Ko | |
| 6,011,403 A | 1/2000 | Gillette | |
| 6,025,738 A | 2/2000 | Masleid | |
| 6,028,490 A | 2/2000 | Komatsu | |
| 6,031,403 A | 2/2000 | Gersbach | |
| 6,087,886 A | 7/2000 | Ko | |
| 6,114,840 A | 9/2000 | Farrell et al. | |
| 6,127,872 A * | 10/2000 | Kumata | 327/276 |
| 6,154,099 A * | 11/2000 | Suzuki et al. | 331/57 |
| 6,154,100 A | 11/2000 | Okamoto | |
| 6,172,545 B1 | 1/2001 | Ishii | |
| 6,172,943 B1 | 1/2001 | Yuzuki | |
| 6,188,260 B1 | 2/2001 | Stotz et al. | |
| 6,204,710 B1 | 3/2001 | Goetting et al. | |
| 6,229,747 B1 | 5/2001 | Cho et al. | |
| 6,238,522 B1 | 5/2001 | Graf | |
| 6,242,936 B1 | 6/2001 | Ho et al. | |
| 6,242,937 B1 | 6/2001 | Lee et al. | |
| 6,262,601 B1 | 7/2001 | Choe et al. | |
| 6,281,706 B1 | 8/2001 | Wert et al. | |
| 6,321,282 B1 | 11/2001 | Horowitz et al. | |
| 6,400,230 B2 | 6/2002 | Fairbanks | |
| 6,407,571 B1 | 6/2002 | Furuya et al. | |
| 6,426,641 B1 | 7/2002 | Koch et al. | |
| 6,455,901 B2 | 9/2002 | Kameyama et al. | |
| 6,476,632 B1 | 11/2002 | La Rosa et al. | |
| 6,489,796 B2 | 12/2002 | Tomishima | |
| 6,535,014 B2 | 3/2003 | Chetlur et al. | |
| 6,538,471 B1 | 3/2003 | Stan et al. | |
| 6,538,522 B1 * | 3/2003 | Aipperspach et al. | 331/57 |
| 6,538,957 B2 | 3/2003 | Magoshi | |
| 6,545,519 B1 | 4/2003 | Carballo | |
| 6,570,407 B1 | 5/2003 | Sugisawa et al. | |
| 6,573,777 B2 | 6/2003 | Saint-Laurent et al. | |
| 6,577,157 B1 | 6/2003 | Cheung et al. | |
| 6,577,176 B1 | 6/2003 | Masleid et al. | |
| 6,621,318 B1 | 9/2003 | Burr | |
| 6,657,504 B1 | 12/2003 | Deal et al. | |
| 6,664,837 B1 | 12/2003 | Oh, et al. | |
| 6,690,242 B2 | 2/2004 | Fang et al. | |
| 6,696,863 B2 | 2/2004 | Yamamoto et al. | |
| 6,697,929 B1 | 2/2004 | Cherkauer et al. | |
| 6,724,214 B2 | 4/2004 | Manna et al. | |
| 6,731,140 B2 | 5/2004 | Masleid et al. | |
| 6,731,179 B2 | 5/2004 | Abadeer et al. | |
| 6,759,863 B2 | 7/2004 | Moore | |
| 6,762,966 B1 | 7/2004 | La Rosa et al. | |
| 6,774,734 B2 * | 8/2004 | Christensen et al. | 331/57 |
| 6,798,230 B1 | 9/2004 | Taylor et al. | |
| 6,815,971 B2 | 11/2004 | Wang et al. | |
| 6,815,977 B2 | 11/2004 | Sabbavarapu et al. | |
| 6,831,494 B1 | 12/2004 | Fu et al. | |
| 6,882,172 B1 | 4/2005 | Suzuki et al. | |
| 6,885,210 B1 | 4/2005 | Suzuki | |
| 6,903,564 B1 | 6/2005 | Suzuki | |
| 7,038,483 B1 | 5/2006 | Suzuki et al. | |
| 7,046,094 B2 | 5/2006 | Belluomini et al. | |
| 7,053,680 B2 | 5/2006 | Masleid et al. | |
| 7,119,580 B2 | 10/2006 | Masleid et al. | |
| 7,126,365 B2 | 10/2006 | Suzuki | |
| 7,212,022 B2 | 5/2007 | Suzuki | |
| 7,235,998 B1 | 6/2007 | Suzuki | |
| 7,304,503 B2 | 12/2007 | Masleid et al. | |
| 7,315,178 B1 | 1/2008 | Suzuki | |
| 7,336,103 B1 | 2/2008 | Masleid et al. | |
| 7,414,485 B1 | 8/2008 | Masleid | |
| 2001/0000426 A1 | 4/2001 | Sung et al. | |
| 2001/0028278 A1 | 10/2001 | Ooishi | |
| 2001/0030561 A1 | 10/2001 | Asano et al. | |
| 2001/0052623 A1 | 12/2001 | Kameyama et al. | |
| 2002/0056016 A1 | 5/2002 | Horowitz et al. | |
| 2002/0178415 A1 | 11/2002 | Saraf | |
| 2003/0057775 A1 | 3/2003 | Yamashita et al. | |
| 2003/0127241 A1 | 7/2003 | Russell et al. | |
| 2003/0160630 A1 | 8/2003 | Earle | |
| 2003/0189465 A1 | 10/2003 | Abadeer et al. | |
| 2003/0231713 A1 | 12/2003 | Masleid et al. | |
| 2004/0044983 A1 | 3/2004 | Dillon et al. | |
| 2004/0104731 A1 | 6/2004 | Vollersten et al. | |
| 2004/0119501 A1 | 6/2004 | Sabbavarapu et al. | |
| 2004/0119503 A1 | 6/2004 | Jamshidi et al. | |
| 2004/0148111 A1 | 7/2004 | Gauthier et al. | |
| 2004/0257115 A1 | 12/2004 | Bertram et al. | |
| 2005/0184720 A1 * | 8/2005 | Bernstein et al. | 324/71.1 |
| 2005/0212547 A1 | 9/2005 | Suzuki | |
| 2005/0248368 A1 | 11/2005 | Bertram et al. | |
| 2007/0136707 A1 | 6/2007 | Teig et al. | |

FOREIGN PATENT DOCUMENTS

| | | |
|---|---|---|
| JP | 03089624 | 4/1991 |
| JP | 04091516 | 3/1992 |

OTHER PUBLICATIONS

Oner et al., "A Compact Monitoring Circuit for Real-Time On-Chip Diagnosis of Hot-Carrier Induced Degradation", Microelectronic test structures, Proceedings, IEEE International Conference in Monterey, CA, Mar. 17, 1997-Mar. 20, 1997, pp. 72-76.

Peters, Laura, "NBTI: A Growing Threat to Device Reliability", Semiconductor International, Mar. 1, 2004, http://www.reed-electronics.com/semiconductor/article/CA386329?industryid=3033.

Reddy, V. et al., "Impact of Negative Bias Temperature Instability on Digital Circuit Reliability", 2002 IEEE International Reliability Physics Symposium Proceedings, Dallas, TX, Apr. 7, 2002-Apr. 11, 2002.

Nalamalpu, et al., " Boosters for Driving Long OnChip Interconnects-Design Issues, Interconnect Synthesis, and Comparison With Repeaters", Jan. 2002, IEEE Transactions on Computer-Aided Design of Integrated Circuits and Systems, vol. 21, No. 1, pp. 50-62. cited by other.

Lima T., et al., "Capacitance Coupling Immune, Transient Sensitive Accelerator for Resistive Interconnect Signals of Subquarter Micron ULSI" IEEE Journal of Solid-State Circuits, IEEE Inc. New York, US pp. 531-536. cited by other. Apr., 1996 /Rjj/.

Notice of Allowance, Mail Date Apr. 17, 2008; U.S. Appl. No. 11/322,595.

Notice of Allowance, Mail Date Jul. 06, 2007; U.S. Appl. No. 11/322,595.

Notice of Allowance, Mail Date Oct. 24, 2007; U.S. Appl. No. 11/322,595.

Notice of Allowance, Mail Date 12-05-07; U.S. Appl. No. 11/322,595.

Non Final Action; Mail Date Oct. 10, 2009; U.S. Appl. No. 12/194,504.

US 2003/0018946 A1, 10/2003, Abadeer et al. (withdrawn)

* cited by examiner

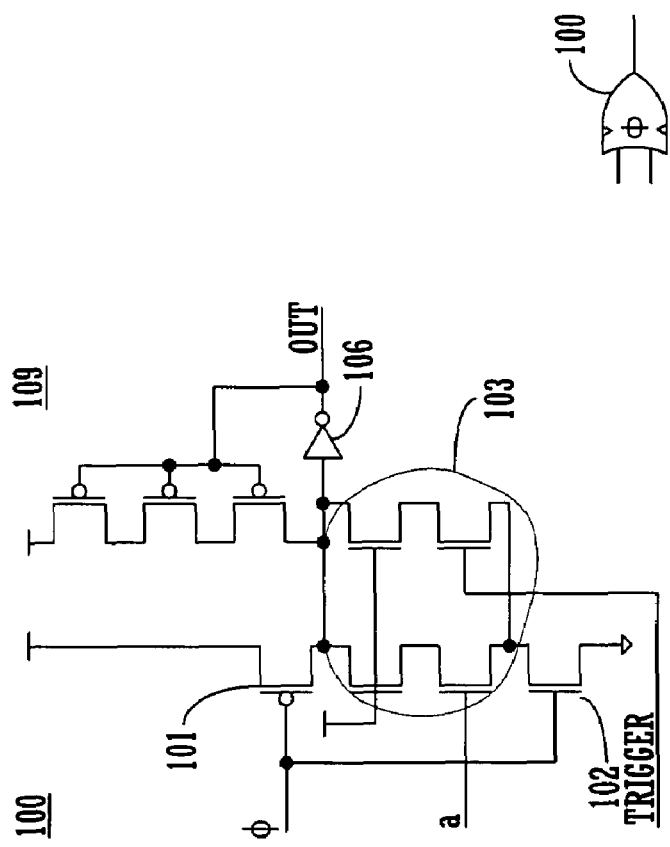

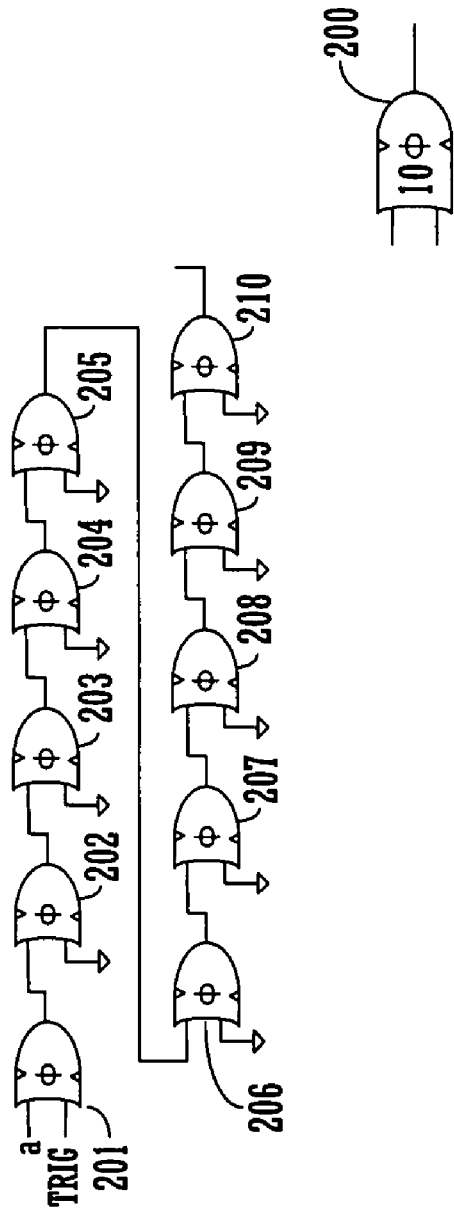
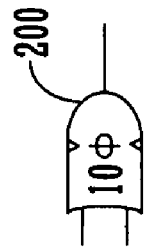
FIGURE 2A
FIGURE 2B

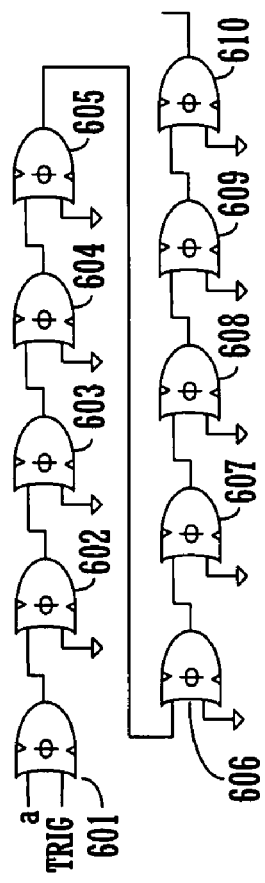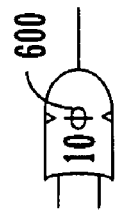
FIGURE 6A
FIGURE 6B

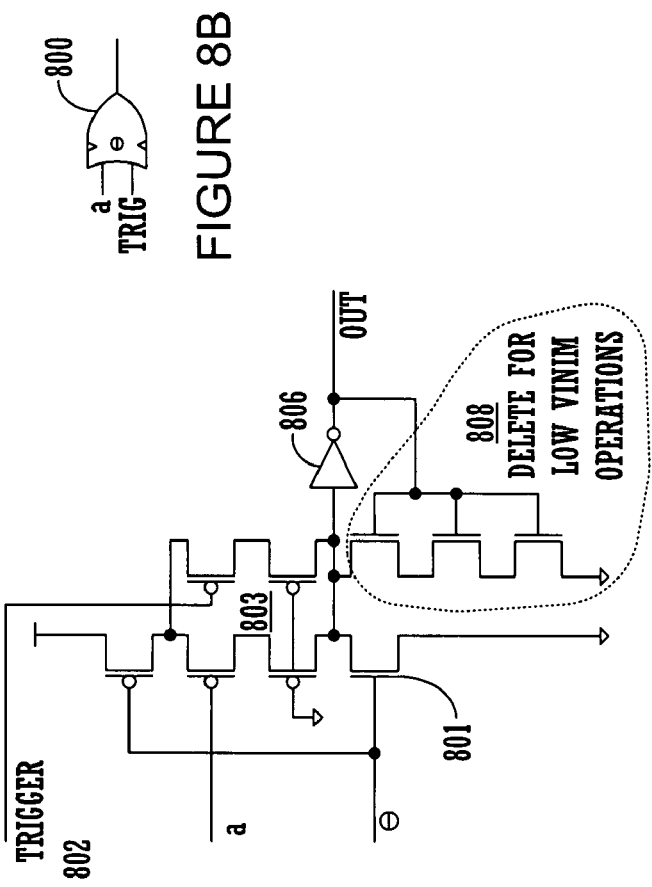

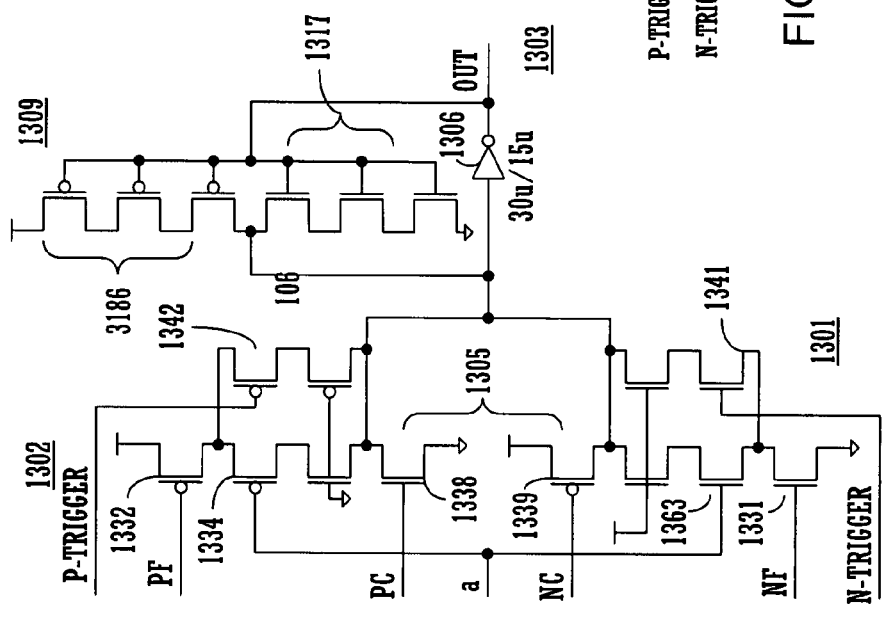
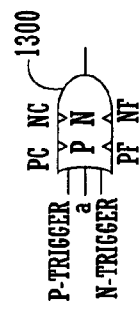
FIGURE 13A
FIGURE 13B

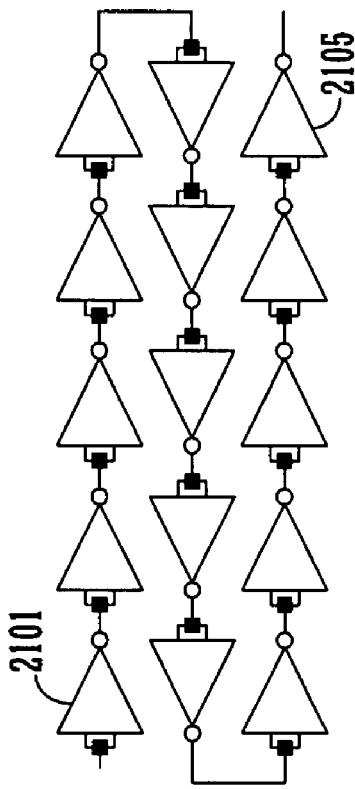
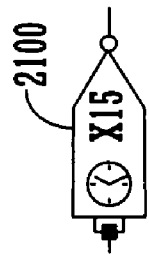
FIGURE 21A
FIGURE 21B

CIRCUITS, SYSTEMS AND METHODS RELATING TO A DYNAMIC DUAL DOMINO RING OSCILLATOR

TECHNICAL FIELD

The present invention relates to the field of electronics. More specifically, embodiments of the present invention relate to a circuit, systems and methods relating to a dynamic dual domino ring oscillator.

BACKGROUND

Ring oscillators conventionally have an odd number of inversion stages and use static circuits. These properties can constrain the usefulness of conventional ring oscillators in some applications.

SUMMARY

Accordingly, a ring oscillator that is unconstrained by properties inherent in conventional ring oscillators may achieve utility in the applications in which conventional ring oscillators cannot effectively function.

Circuits, systems and methods relating to a dynamic dual domino ring oscillator are disclosed. Embodiments relating to the dynamic dual dynamic ring oscillator disclosed herein are not constrained by properties inherent in conventional ring oscillators. The embodiments disclosed herein is useful in applications in which conventional ring oscillators cannot effectively function. In one embodiment, the dual domino ring oscillators described herein allow for accurate, high precision determination of the relative strengths of the N-based and P-based components therein and obviate analog circuits and/or other digital circuits for this purpose.

A dynamic dual domino oscillating ring circuit is described, which has multiple non-inverting dual domino circuits, each having a signal input, N and P-domino triggers, precharge and pre-discharge, N and P-domino cutoffs and an output inverter. A number of the dual domino circuits are coupled in series, the output of one feeding the input of the next, to form a dual domino chain, which form stages of the dual domino ring. A number of the stages are coupled in series, the output of one feeding the input of the next, to form the ring. The first dual domino circuit of the chain receives a signal input and the N and P triggers for the chain. Within the ring, the output of each stage feeds the input signal to the next stage and is fed back to clock an earlier stage to allow the ring to oscillate.

Embodiments of the present invention include circuits, systems and methods relating to dynamic dual domino ring oscillators. A dynamic dual domino oscillating ring circuit is described below, which has multiple non-inverting dual domino circuits, each having a signal input, N and P-domino triggers, precharge and pre-discharge, N and P-domino cutoffs and an output inverter. A number of the dual domino circuits are coupled in series, the output of one feeding the input of the next, to form a dual domino chain, which form stages of the dual domino ring. A number of the stages are coupled in series, the output of one feeding the input of the next, to form the ring. The first dual domino circuit of the chain receives a signal input and the N and P triggers for the chain. Within the ring, the output of each stage feeds the input signal to the next stage and is fed back to clock an earlier stage to allow the ring to oscillate.

Embodiments of the present invention thus relate to a dual domino ring oscillator that is unconstrained by properties inherent in conventional ring oscillators. Therefore, embodiments of the present invention may achieve beneficial utility in the applications in which conventional ring oscillators cannot effectively function. For instance, embodiments of the present invention achieve ring oscillators with component elements thereof reflective of a circuit under study (e.g., design, analysis, etc.), in relation to various parameters (e.g., design and/or operating attributes, etc.).

Advantageously, easily observed and measured electrical characteristics of the ring oscillator such as the oscillating frequency (e.g., the operating frequency of the oscillating ring) can reveal more difficult to measure parameters, such as the operating delay of the oscillator's dynamic circuits. Even properties deeply embedded within the microscopic and sub-microscopic structures comprising the component elements of the circuit can be revealed.

For instance, subtle frequency differences between the oscillations of complementary N type and P-type oscillating rings, which are ostensibly otherwise identical (e.g., in design and fabrication) can indicate relative P to N ratios such as the relative strengths of the component N-type field effect transistors (FETs) and P-type FETs (NFETs and PFETs, respectively). Further, this is indicated by the embodiments described herein to levels of accuracy and precision that conventionally can be costly and/or troublesome achieve, and require high precision analog apparatus to measure.

The dual domino circuits and chains comprising the dual domino ring oscillators described below drive the same, substantially capacitive, load. Thus, the various dynamic stages of the dual domino ring oscillators described below display inherent capacitive attributes as the respective dynamic stages operate. Such inherent capacitance swings with the constituent NFETs and PFETs of the component dual domino stages thereof. Thus, the substantially capacitive load the dual domino ring oscillator works to drive is effectively shared by the NFETs and PFETs comprising its stages. Moreover, the dual domino circuits and chain stages comprising such dual domino ring oscillators share common buffer stages, as well. Advantageously therefore, the respective frequency related contributions of the N-domino components and the P-domino components of the dual domino ring oscillator uniquely differ by the relative strength of the constituent NFETs and PFETs. The dual domino ring oscillators described below thus provide the benefit of allowing accurate and highly precise comparison of the relative strengths of its constituent NFET and PFET strengths, which can provide great concomitant benefits in circuit design, analysis and engineering.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description are not drawn to scale.

FIG. 1A depicts an exemplary N-footed domino circuit diagram, according to an embodiment of the present invention.

FIG. 1B depicts a representation of an exemplary N-footed domino circuit, according to an embodiment of the present invention.

FIG. 2A depicts an exemplary chain of N-domino circuits, according to an embodiment of the present invention.

FIG. 2B depicts a representation of an exemplary chain of N-domino circuits, according to an embodiment of the present invention.

FIG. 6A depicts an exemplary chain of other N-domino circuits, according to an embodiment of the present invention.

FIG. 6B depicts a representation of another exemplary chain of other N-domino circuits, according to an embodiment of the present invention.

FIG. 8A depicts an exemplary P-footed domino circuit diagram, according to an embodiment of the present invention.

FIG. 8B depicts a representation of an exemplary P-footed domino circuit, according to an embodiment of the present invention.

FIGS. 13A and 13B respectively depict a diagram and a representation of an exemplary dual footed domino circuit stage, according to an embodiment of the present invention.

FIGS. 21A and 21B respectively depict a diagram and a representation of an exemplary delay chain, according to an embodiment of the present invention.

DETAILED DESCRIPTION

Figure 3:
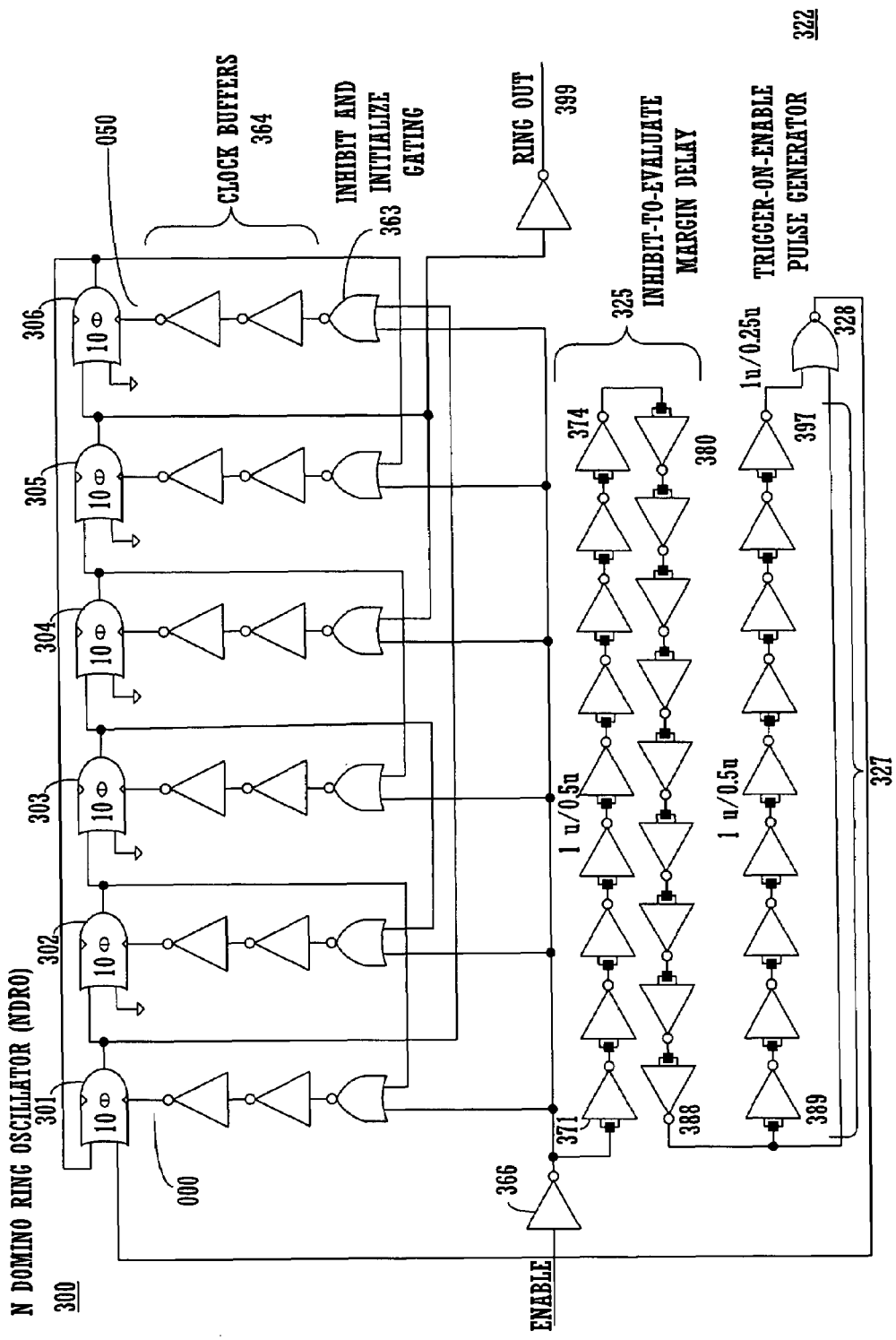
FIG. 3 depicts an exemplary N-Domino ring oscillator, according to an embodiment of the present invention.

Exemplary embodiments of circuits, systems and methods relating to a dynamic dual domino ring oscillator are described below. Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

Although the circuits, systems and methods of embodiments of the present invention can be implemented in a variety of different dynamic ring circuits, one exemplary embodiment includes a dynamic dual domino oscillating ring circuit that has multiple non-inverting dual domino circuits, each having a signal input, a trigger input, inputs for charge state and cutoff clocks and an output inverter. A number of the dual domino circuits are coupled in series, the output of one feeding the input of the next, to form a dual domino chain, which form stages of the ring. A number of the stages are coupled in series, the output of one feeding the input of the next, to form the ring. The first dual domino circuit of said chain receives a logic signal input and a single trigger input for the chain. Within the dual domino ring, the output of each stage feeds the input signal to the next stage and is fed back to clock an earlier stage to allow the ring to oscillate. The description of exemplary circuits, systems and methods relating to dual dynamic ring oscillator according to embodiments of the present invention commences with Section II at FIG. 13 herein. Presented first, Section I with FIGS. 1-12B represent a discussion of exemplary circuits, systems and methods relating to a dynamic ring oscillator, to provide context for and to the description of the exemplary dual domino ring oscillator.

Section I

Circuits, Systems and Methods Relating to a Dynamic Ring Oscillator

Exemplary N-Footed Domino Circuit

FIG. 1A depicts an exemplary N-footed domino circuit 100, according to an embodiment of the present invention. The operating frequency of N-footed domino circuit 100 is dominated by NFET attributes. However, P-footed domino circuits, dominated by PFET attributes, can also be implemented, which are complementary to the N-footed circuits described herein. Domino circuit 100 has a clocked precharge device 101 and a clocked cutoff device 102. Domino circuit 100 has two inactive inputs at Vdd, an active input 'a' and a trigger input. A logic tree 103 performs a logic function. Various logic functions can be implemented with logic tree 103. In one embodiment, logic tree 103 performs a two by two AND/OR function with two series NFETs in parallel with two other NFETs in series.

An inverter 106 buffers and inverts the output of domino circuit 100. The output is fed back to a half latch circuit 109, which acts as a jamb latch, and is latched therewith. In one embodiment, latch circuit 109 comprises a half latch formed by three series coupled devices. This has the benefit of reducing the strength of half latch 109 in relation to downstream pull-down devices, such as are in an evaluation stack as will be described below. Half latch 109 functions to sustain a stable state for circuit 100 where significant leakage may be present, such as wherein circuit 100 comprises ultra-deep sub-micron structures.

Precharge occurs when the clocked cutoff NFET device 102 is turned off, as when the clock is low. With the clocked cutoff NFET 102 off, Inputs are effectively insignificant because their potential paths are in a high impedance state. The low clock at the clocked precharge PFET device 101 turns it on. This charges the dynamic element 103. The half latch 109 functions to reinforce the precharge condition. Thus, if the clock signal disappears, the domino circuit 100 remains in a precharge condition.

FIG. 1B depicts a representation of exemplary N-footed domino circuit 100, according to an embodiment of the present invention. In FIG. 1B, for simplicity in describing exemplary embodiments below, domino circuit 100 (as described with reference to FIG. 1A) is depicted in a simplified symbolism as a logic unit having the two inputs 'a' and 'trigger' and two clock marks, one clock for precharge and the other for foot cutoff.

Exemplary Domino Circuit Chain

FIG. 2A depicts an exemplary chain 200 of ten N-domino circuits 201-210, according to an embodiment of the present invention. Other numbers (e.g., numbers beside 10) of domino circuits can be so chained. In the present embodiment, the ten domino circuits 201-210, all of them substantially identical to the domino circuit 100 (FIG. 1A & 1B), are effectively connected together in a simple series configuration to form chain 200.

The input 'a' and the trigger signal are available to domino circuit 201, e.g., the first domino circuit in chain 200. The output of domino circuit 201 effectively comprises the analog of the input 'a' for the subsequent domino circuit 202 in chain 200. The trigger input for domino circuit 202 however is effectively disabled e.g., by grounding, as it is like the other domino circuits 203-210 downstream therefrom. The precharge and foot cutoff clocks are fed to all domino circuits 201-210 in parallel. Thus, the domino circuits 201-210 are clocked effectively simultaneously.

Each domino circuit stage (e.g., domino circuits 201-210) of chain 200 has a certain delay associated with its evaluation operation, e.g., with outputting a logic response based upon receiving an input. It is convenient to consider the exemplary delay associated with a single domino circuit in chain 200 as comprising one delay unit of time.

The delay associated with a signal propagating through chain 200 is greater than a single delay unit. In the present implementation wherein chain 200 may comprise ten individual domino circuits 201-210 in series, its overall chain delay effectively exaggerates the forward evaluate delay associated with a single one of its component domino circuit by a factor of ten. The precharge time (and foot cutoff) time however is the same for chain 200 as for its individual domino circuit components 201-210, because the precharge (and cutoff signals) are delivered in parallel thereto.

FIG. 2B depicts a representation of exemplary chain 200 of N-domino circuits, according to an embodiment of the present invention. In FIG. 2B, for simplicity in describing exemplary embodiments below, domino circuit chain 200 (as described with reference to FIG. 2A) is depicted in a simplified symbolism as a ten unit (e.g., series) logic element having the two inputs 'a' and 'trigger' and two clock marks, one clock for precharge and the other for foot cutoff.

FIG. 3 depicts an exemplary N-Domino ring oscillator 300, according to an embodiment of the present invention. Domino ring oscillator 300 effectively comprises a ring of six domino chains 301-306. Other numbers (e.g., numbers beside 6) of domino chains 300 can be so chained. In the present embodiment, the six domino chains 301-306, all of them substantially identical to the domino chain 200 (FIGS. 2A & 2B), are effectively connected together in a simple ring configuration to form oscillating domino ring 300. The operating frequency of ring 300 can be monitored at any of its outputs. In the present implementation, inverter 399 buffers the output of domino chain 305 to comprise the output of ring 300.

All around the ring 300, the input 'a' of any of chains 301-306 effectively comprises the output of the chain immediately preceding it in the ring 300. Bearing in mind the ring configuration of oscillating ring 300, it may be convenient at least graphically to think of the output of chain 306 as that of the "last" stage in ring 300 as drawn. In that sense, the output of chain 306 can be thought of as being "fed back" to the input 'a' of the "first" stage 301. The trigger input of all the chains except one are effectively disabled (e.g., to ground). In the present implementation, chain 301 is triggered by a pulse generator 322. Inhibit and initialization functions of the domino chains 301-306 are controlled by their respective gates 363 through inverters 364. Gates 363 operate with a clocked enable signal via inverter 366 and an output of another domino chain, e.g., the next subsequent domino chain in ring 300.

Exemplary Timing Diagram

Figure 4:
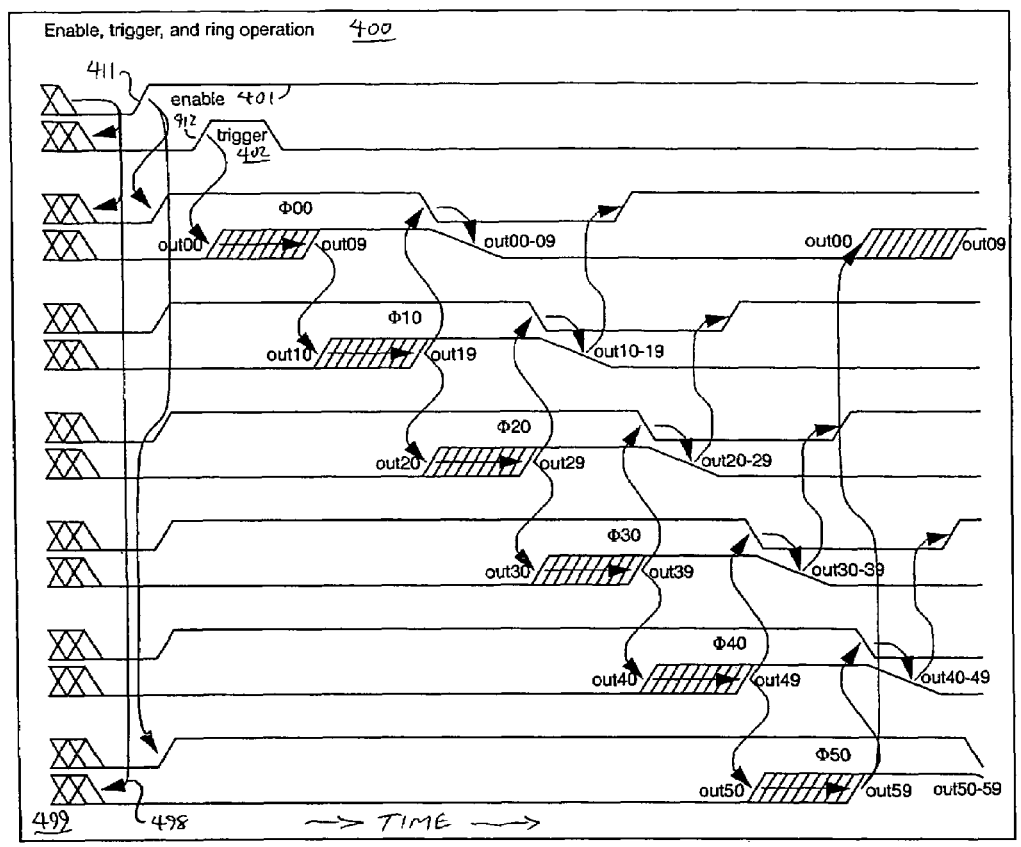
FIG. 4 depicts an exemplary timing sequence for an N-Domino ring oscillator of FIG. 3, according to an embodiment of the present invention.

FIG. 4 depicts an exemplary timing sequence 400 for N-Domino ring oscillator 300 of FIG. 3, according to an embodiment of the present invention. FIGS. 3 and 4 are discussed simultaneously to describe operations relating to an embodiment of the present invention. Region 499 (crosshatched), at the far left of timing diagram 400, comprises an undefined, e.g., a "do not care" region, wherein any inputs effectively lack significance.

When the enable signal 401 is brought low, all of the domino circuits in chains 301-306 go to their 'precharge' condition. When the enable signals go low and the clocks go low (e.g., through ordinary combinatorial logic), all of the NFET clocked cutoff devices are off and all PFET clocked precharge devices turn 'on.' The dynamic nodes all go 'high' and are sustained in that 'high' condition with 109 (FIG. 1A). When the 'enable' signal goes low, each of the six clock groups Φ00-Φ50 go to the precharge state, where they are kept by latch 109. As shown in FIG. 3, ring oscillator 300 effectively comprises a ring of 60 circuits, e.g., the non-inverting domino chains 301-306. Positive feedback unconditionally forces ring 300 to a state wherein its outputs are all low, in which state it can be latched indefinitely. Latched low, ring 300 effectively comprises a storage element having an even number of inverter stages, which will thus not oscillate.

As the enable signal 401 goes high at rising edge 411, each of the domino circuits of ring 300 is parked in a 'waiting to evaluate' condition with their dynamic nodes latched high, their clock precharge devices (e.g., precharge device 101; FIG. 1A) turned off and their clocked cutoff (e.g., cutoff device 102; FIG. 1A) on. The components of ring 300 comprise domino circuits (e.g., circuits 100, 200; FIG. 1A-1B, FIG. 2A-2B, respectively). Where any single domino circuit of ring 300 evaluates, it forces the next domino circuit of ring 300 into an evaluate state as well. Thus, where any (e.g., single) input thereof turns on, it will cause its associated dynamic nodes to discharge and the output thereof rises high, which comprises a high input to the next stage of ring 300 and begins a domino cascade in ring 300.

The cascade of the domino circuits of ring 300 can be started with the firing of a momentary high pulse to one of the trigger inputs of one of the domino circuits. Trigger pulses can be supplied with any convenient pulse source. For instance, trigger pulses can be supplied to begin oscillation of ring 300 from an external source. In one embodiment, the domino cascade in ring 300 is started with a trigger pulse supplied by trigger generator 322. Pulse generator 322 functions as an edge detector and operates on the rising edge 411 of enable signal 401.

To recap thus far, from undefined region 499, the enable signal 401 is brought low and ring 300 is initialized as all of its domino circuits are precharged. Upon precharging, enable signal 401 is brought high and the domino circuits comprising ring 300 enter a 'ready to evaluate' condition. After a time delay TD that begins with the enable signal 101 going high, pulse generator 322 converts the edge 411 into a trigger pulse 402, which fires the trigger input of domino chain 301. The delay TD between the rising edge 411 of enable signal 401 and the rising edge 412 of the trigger signal 402 corresponds to the delay associated with the operation of a delay chain 325, comprised of stacked inverters 371-388. Significantly, pulse generator 322 is external to the ring 300; it does not comprise a component of the ring itself. In fact, in other embodiments triggering is externally supplied to circuit 300. Thus, the ring 300 is effectively self-untriggered.

Stacked inverters are described in co-pending U.S. patent application Ser. No. 10/864,271 by Robert P. Masleid, et al. and assigned to the assignee of the present invention, which is incorporated herein by reference as background material. Stacked inverters can be considered logically as simply inverters. With respect to their operational performance however, stacked inverters function with twice the input capacitance and half of the output drive capacity of non-stacked inverters. Thus, stacked inverters comprise relatively slow circuits. While relatively inefficient for signal propagation, chained inverters excel at introducing delay.

The chain of 18 stacked inverters 371-388 thus efficiently functions as a delay chain 325. The first delay chain 325, shown in an articulated configuration, is logically non-inverting because each of the stacked inverters therein are paired with another. Delay chain 325 helps to set the inhibit-to-evaluate margin delay associated with ring 300. The output of segment 325, e.g., of stacked inverter 388, enables logic gate 328 and is supplied to a second delay chain 327, e.g., at the input of stacked inverter 389. The second delay chain 327 functions as a trigger-on-enable pulse generating unit and determines the actual width of the trigger pulse. Upon the input of delay chain 327, e.g., at the output of stacked inverter 388, the enabled logic gate 328 fires a trigger pulse to the trigger input of domino chain 301, which is parked at that time in its 'waiting to evaluate' condition. The pulse ends upon the output of delay chain 327.

Other triggering schemes are used in other embodiments. In another embodiment, pulse trigger 322 comprises another circuit that imparts an effective inhibit-to-evaluate margin delay function and/or another trigger-on-enable pulse generation function. In yet another embodiment, trigger pulses are provided externally. Importantly, the ring 300 is effectively self-untriggered. Significantly, pulse generation is external to the ring 300; it does not arise from a component of the ring itself.

At this point, all domino chains of ring 300, e.g., domino chains 301-306, are parked in their 'waiting to evaluate' condition. When a domino circuit in a 'waiting to evaluate' condition is triggered, that domino circuit performs its evaluate function. Thus, upon triggering domino chain 301, the dynamic nodes of its constituent domino circuits discharge and its output rises high. In a sense, the first domino (e.g., domino chain 301) of ring 300 "falls" and starts oscillation therein as follows. As domino chain 301 so falls, its high output is fed to the input 'a' of domino chain 302, which is thus forced to evaluate as well. When domino chain 302 evaluates, e.g., when "the next domino falls" in ring 300, its output rises high.

The output of domino chain 302 is fed to input 'a' of domino chain 303, e.g., the "next" domino chain in ring 300. Thus, domino chain 303 is forced to evaluate, whereupon its output rises high. Yet another domino of ring 300 falls. The output of domino chain 303 is fed to input 'a' of domino chain 304, e.g., the next domino chain in ring 300. Thus, domino chain 304 is forced to evaluate, whereupon its output rises high. The output of domino chain 304 is fed to input 'a' of domino chain 305, which is thus forced to evaluate, whereupon its output rises high.

The output of domino chain 305 is fed to input 'a' of domino chain 306, which is thus forced to evaluate, whereupon its output rises high. All of the dominos of ring 300 have thus fallen. The output of domino chain 306 is fed to the input 'a' of domino chain 301, completing a first domino cascade in ring 300. Further, the output of domino chain 305 is buffered by inverter 399. The output of inverter 399 comprises the output of ring 300.

The sequence of operation in ring 300 can be synopsized as follows. In undefined region 499, inputs to ring 300 lacked significance. Upon initialization 498, the enable signal 401 went low. All domino circuits of ring 300 thus went to their precharge condition and their outputs went low. When the enable signal 401 went high, all domino circuits of ring 300 went to their ready-to-evaluate condition and waited for a trigger. Upon firing the trigger pulse, the first of the domino circuits of ring 300 falls, e.g., domino chain 301 evaluates and causes the other domino circuits of ring 300 to, in succession, evaluate and cause the next domino chain in the ring to evaluate.

More specifically, the sequence of operation in ring 300 can be described as follows thus far. The rising edge 412 of trigger pulse 402 causes output 00 (e.g., of the first domino circuit of ten-domino circuit chain 301) to rise high, which causes the next nine outputs 01-09 to rise high. The rise of output 09 in turn causes the domino circuits comprising the next domino chain in ring 300 to fall. Thus outputs 10-19 rise. These in turn cause the next domino circuits comprising the next domino chain in ring 300 to fall. Thus outputs 20-29 rise. These in turn cause the next domino circuits comprising the next domino chain in ring 300 to fall. Thus outputs 30-39 rise. These in turn cause the next domino circuits comprising the next domino chain in ring 300 to fall. Thus outputs 40-49 rise. These in turn cause the next domino circuits comprising the next domino chain in ring 300 to fall. Thus outputs 50-59 rise.

At this point, all the dominos of ring 300 have fallen. All outputs are high, and an even number of inversions has occurred around loop 300, which is thus again in a stable state, in which it can be latched. No oscillating action has yet occurred in ring 300. However, the outputs of each of domino chains 301-306 is periodically tapped and fed back to the clocking gate associated with one of the domino chains at an "earlier" position in ring 300. Thus, after a group of domino circuits (e.g., domino chain 301, etc.) has fallen, its output is fed back with a clock to a "previous" set of domino circuits.

The output of domino chain 301 for instance is fed back to the inhibit and initialize gate 363 associated with domino chain 306. The output of domino chain 306 for instance is fed back to the gate 363 associated with domino chain 305. The output of domino chain 305 for instance is fed back to the gate 363 associated with domino chain 304. The output of domino chain 304 for instance is fed back to the gate 363 associated with domino chain 303. The output of domino chain 303 for instance is fed back to the gate 363 associated with domino chain 302. And in the present exemplary implementation, the output of domino chain 302 is fed back to the inhibit and initialize gate 363 associated with domino chain 301.

Thus, after one group of dominos (e.g., domino chain 301) has fallen, its output is used to feed back to a gate 363 associated with a previous set of dominos (e.g., domino chain 306), which upon a clock thereto puts that associated set back into a precharge condition. Upon precharging that associated domino set, the clock is switched back to a ready to evaluate condition. The rate of signal propagation around ring 300 is related to (e.g., dependent on, proportional to, etc.) the forward evaluate time of the ring, e.g., the time it takes to evaluate an input, e.g., to generate an output corresponding thereto. However, before the evaluation "returns" to the same point in ring 300, another component circuit of the ring has already precharged the domino circuit at that point.

Thus, the domino chains' fall and the evaluating continues indefinitely around the ring, substantially unabated, establishing an oscillation therein. Importantly, ring 300 thus comprises an effective ring oscillator having an even number of inverting stages, each comprising dynamic circuits. Further, ring 300 uses effectively self-resetting logic signals to perpetuate its oscillation. The outputs of each component domino chain of ring 300 feed back to a stage at some point previous in the ring (e.g., one or more positions earlier). Thus, the ring 300 is effectively self-untriggered. In the present embodiment, the outputs of each component domino chain of ring 300 feed back one stage earlier in ring 300. However, ring 300 can be implemented with the outputs of each of its component domino chains fed back to a stage at any point selected that is previous in the ring to the outputting stage.

Thus, the trigger pulse effectively causes outputs 00-09 to fall low. This effect is perpetuated for outputs 20-29, etc. through 50-59. The output 29 is brought back up to the Φ10 clock (e.g., input to gate 363 therewith) and is used to bring Φ10 low. (In a similar way, output 19 has a similar affect with Φ00, etc.) The Φ10 then remains low until output 29 is precharged, at which point Φ10 returns to a high condition.

Importantly, oscillating ring 300 has an even number of inverting stages and uses logic signals of components thereof to reset stages situated earlier in the ring, without additional pulse generators. Outputs of the stages comprising ring 300 are fed back to previous stages in the ring. While ring oscillator 300 can conveniently be triggered with an edge detector, pulse generator, etc. represented by pulse generator 388, it should be appreciated that ring oscillator can function without edge detecting and other pulse generators; even operating with externally provided triggering. Ring oscillator 300 comprises a dynamic oscillator that uses a level sensitive completion signal to precharge an upstream stage. In implementations using predominantly PFET precharge devices, the precharge condition described above is analogous to a 'reset' condition.

Considering a stage N of ring 300 whose output comprises a completion signal, its output can be fed back an indefinite number of stages J to a stage that responds to the level of the feedback signal, in contrast to its edge. No trigger pulse is needed to sustain oscillation of ring 300 once it is triggered. Once enabled, ring 300 can be triggered by pulse generator 388 or externally, e.g., with a user supplied trigger pulse. Importantly, no particular trigger circuit is required for the oscillation of ring 300 within its dynamic circuits.

Exemplary Low Voltage Dynamic Ring Oscillator

Figures 5A, 5B:
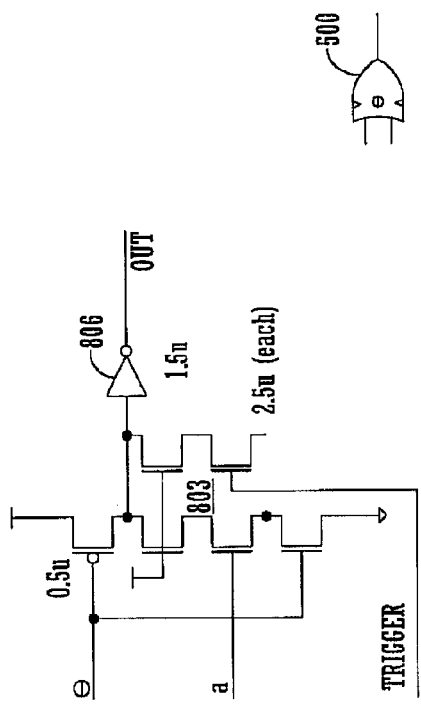
FIG. 5A depicts a diagram of another exemplary N-footed domino circuit, according to an embodiment of the present invention.
FIG. 5B depicts a representation of another exemplary N-footed domino circuit, according to an embodiment of the present invention.

FIG. 5A depicts another exemplary N-footed domino circuit 500, according to an embodiment of the present invention. Circuit 300 (FIG. 3) above relates to domino ring oscillators that are functional for zero frequency (e.g., DC) and/or low frequency operation. Its component circuits thus use half latch 109 (FIG. 1A) to help stabilize its operational states. Domino circuit 500, in contrast, uses no such latching circuit and is operated as an oscillator, suitable for very low voltage (e.g., ultra low minimum voltage or 'Vmin') operation. Otherwise, its operation is similar to (e.g., analogous to, etc.) that of domino circuit 100, described above (with reference to FIGS. 1A and 1B).

FIG. 5B depicts a representation of exemplary N-footed domino circuit 500, according to an embodiment of the present invention. In FIG. 5B, for simplicity in describing exemplary embodiments below, domino circuit 500 (as described with reference to FIG. 5A) is depicted in a simplified symbolism as a logic unit having the two inputs 'a' and 'trigger' and two clock marks, one clock for precharge and the other for clocked cutoff.

FIG. 6A depicts an exemplary chain 600 of ten N-domino circuits 601-610, according to an embodiment of the present invention. As with domino chain 200 discussed above (FIG. 2A, 2B) other numbers (e.g., numbers beside 10) of domino circuits can be so chained. In the present embodiment, the ten domino circuits 601-609, all of them substantially identical to the domino circuit 500 (FIGS. 5A & 5B), are effectively connected together in a simple series configuration to form chain 600.

The input 'a' and the trigger signal are available to domino circuit 601, e.g., the first domino circuit in chain 600. The output of domino circuit 601 effectively comprises the analog of the input 'a' for the subsequent domino circuit 602 in chain 600. The trigger input for domino circuit 602 however is effectively disabled e.g., with grounding, as are the other domino circuits 603-610 downstream therefrom. The precharge and cutoff clocks are fed to all domino circuits 601-610 in parallel. Thus, the domino circuits 601-610 are clocked effectively simultaneously.

FIG. 6B depicts a representation of exemplary chain 600 of N-domino circuits, according to an embodiment of the present invention. In FIG. 6B, for simplicity in describing exemplary embodiments below, domino circuit chain 600 (as described with reference to FIG. 6A) is depicted in a simplified symbolism as a ten unit (e.g., series) logic element having the two inputs 'a' and 'trigger' and two clock marks, one clock for precharge and the other for foot cutoff.

As with the domino circuit 200 discussed above (FIG. 2A, 2B), each domino circuit stage (e.g., domino circuits 601-609) of chain 600 has a certain delay associated with its evaluation operation, e.g., with outputting a logic response based upon receiving an input. For simplicity and brevity in discussing this delay herein (as above), it is convenient to consider the exemplary delay associated with a single domino circuit in chain 600 as comprising one delay unit of time.

The delay associated with a signal propagating through chain 600 is greater than a single delay unit. In the present implementation wherein chain 600 comprises ten individual domino circuits 601-609 in series, its overall chain delay effectively exaggerates the forward evaluate delay associated with a single one of its component domino circuit by a factor of ten. The precharge time (and foot cutoff) time however is the same for chain 600 as for its individual domino circuit components 601-610, because the precharge (and cutoff signals) are delivered in parallel thereto.

With the exception of the functionality attributed to half latch 109 (FIG. 1A) above, and the suitability of circuits 500 and 600 for very low operating voltages, the operation of circuits 500 and 600 are substantially similar to those described above with reference to FIGS. 1A, 1B and 2A, 2B, relating to circuits 100 and 200, respectively and operate in a manner that is substantially analogous to the operation thereof, as described above.

Figure 7:
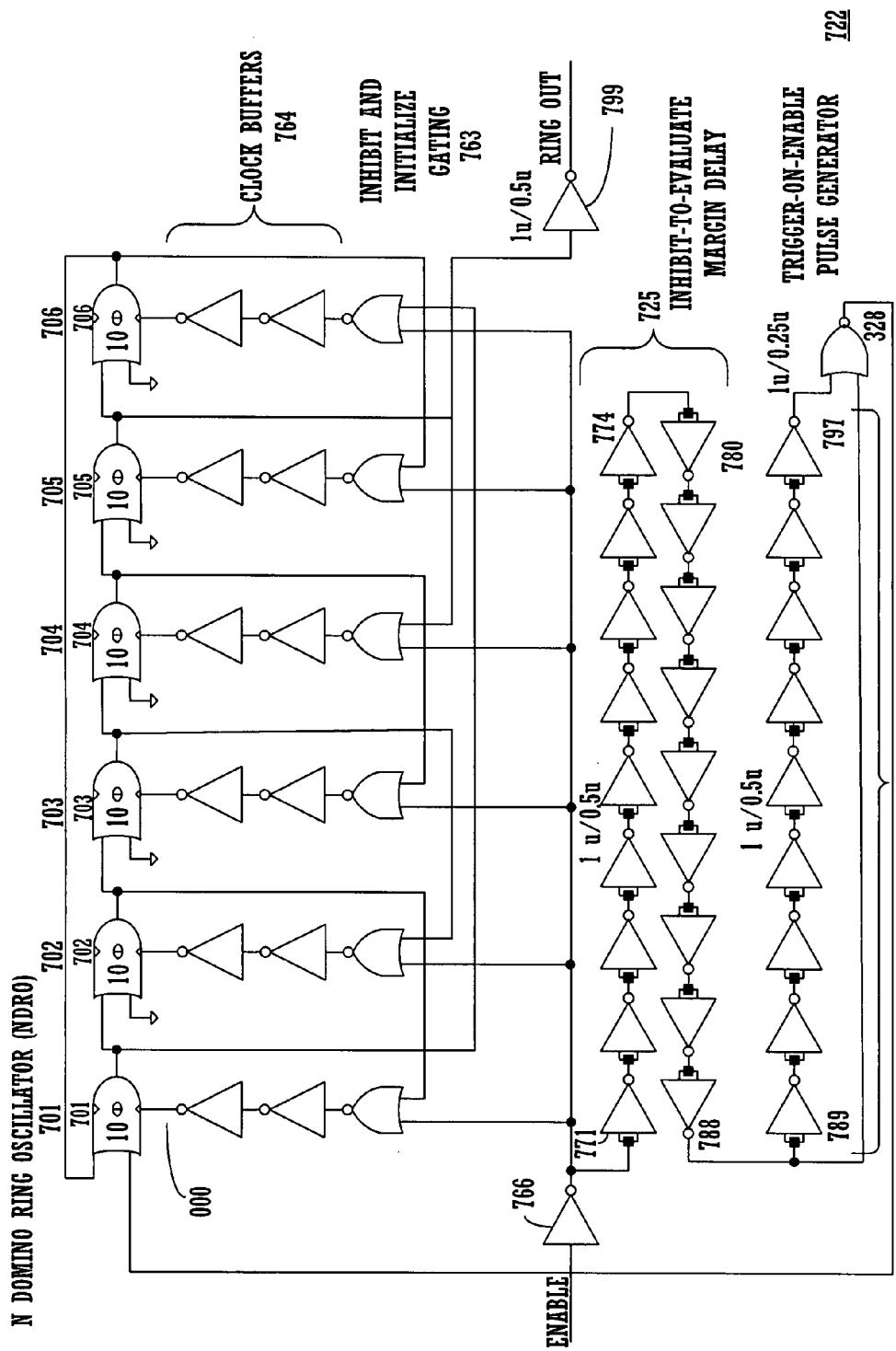
FIG. 7 depicts another exemplary N-Domino ring oscillator, according to an embodiment of the present invention.

FIG. 7 depicts an exemplary N-Domino ring oscillator 700, according to an embodiment of the present invention. Domino ring oscillator 700 is suitable for very low voltage operation and effectively comprises a ring of six domino chains 701-706. Other numbers (e.g., numbers beside 6) of domino chains 700 can be so chained. In the present embodiment, the six domino chains 701-706, all of them substantially identical to the domino chain 600 (FIGS. 6A & 6B), are effectively connected together in an simple ring configuration to form oscillating domino ring 700. The operating frequency of ring 700 can be monitored at any of its outputs. In the present implementation, inverter 799 buffers the output of domino chain 705 to comprise the output of ring 700. Beside its suitability for low voltage operation, ring 700 is substantially similar in structure, function and operation to that described above (e.g., FIG. 3, 4) relating to the operation of ring oscillator 300.

Exemplary P-Footed Domino Circuit

FIG. 8A depicts a diagram of an exemplary P-footed domino circuit 800, according to an embodiment of the present invention. In contrast to the N-footed domino circuits described above, the operating frequency of P-footed domino circuit 800 is dominated by PFET attributes, which is substantially complementary to the NFET dominated operating frequencies relating to those N-footed domino circuits. P-footed domino circuit 800 comprises a substantially complementary circuit to the N-footed domino circuits described above (e.g., N-footed domino circuit 100; FIG. 1A, 1B), and operates in an analogous manner, substantially complementary to the operation thereof as described above. P-footed domino circuit 800 has a P-type cutoff device 802.

DC/Low Frequency and Low Voltage P-Domino Functions Compared

Half latch 809 or a similarly functional latch functions to latch the buffered output of circuit 800, e.g., at the output of inverter 809, to reinforce a pre-discharge state of circuit 800, which is analogous to and substantially complementary to the operation of latch 109 in N-domino circuit 100 (FIG. 1A). Half latch 809 promotes the stability of circuit 800 and thus supports DC and low frequency operation thereof. However, P-domino circuit 800 can effectively be rendered suitable for very low voltage operation by removing (e.g., not having disposed therein, disabling, operating without, etc.) of the latch functionality 809.

FIG. 8B depicts a representation of exemplary P-footed domino circuit 800, according to an embodiment of the present invention. In FIG. 8B, for simplicity in describing exemplary embodiments below, domino circuit 800 (as described with reference to FIG. 8A) is depicted in a simplified symbolism as a logic unit having the two inputs 'a' and 'trigger' and two clock marks, one clock for precharge and the other for foot cutoff.

Exemplary P—Footed Domino Circuit Chain

Figures 9A, 9B:
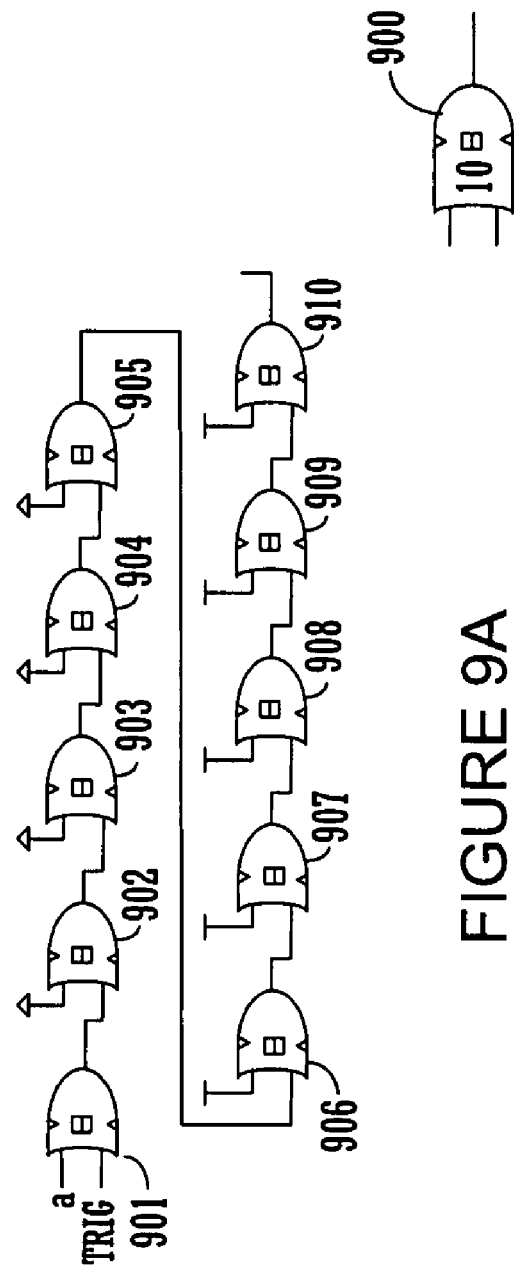
FIG. 9A depicts an exemplary chain of P-domino circuits, according to an embodiment of the present invention.
FIG. 9B depicts a representation of an exemplary chain of P-domino circuits, according to an embodiment of the present invention.

FIG. 9A depicts an exemplary chain 900 of ten P-domino circuits 901-910, according to an embodiment of the present invention. Other numbers (e.g., numbers beside 10) of P-domino circuits can be so chained. In the present embodiment, the ten P-domino circuits 901-910, all of them substantially identical to the P-footed domino circuit 800 (FIGS. 8A & 8B), are effectively connected together in a simple series configuration to form chain 900. P-footed domino chain 900 comprises a complementary circuit to the N-footed domino chains described above (e.g., N-footed domino circuit 200; FIG. 2A, 2B), and operates in a manner substantially complementary to the operation thereof as described above.

As with the N-domino chains described above, the input 'a' and the trigger signal to P-domino chain 900 are available to domino circuit 901, e.g., the first domino circuit in chain 900. The output of domino circuit 901 effectively comprises the analog of the input 'a' for the subsequent domino circuit 902 in chain 900. The trigger input for domino circuit 902 however is effectively disabled e.g., by grounding, as it is like the other domino circuits 903-910 downstream therefrom. The pre-discharge and cutoff clocks are fed to all domino circuits 901-910 in parallel. Thus, the domino circuits 901-910 are effectively clocked simultaneously.

Each domino circuit stage (e.g., domino circuits 901-910) of chain 900 has a certain delay associated with its evaluation operation, e.g., with outputting a logic response based upon receiving an input. It is convenient to consider the exemplary delay associated with a single domino circuit in chain 900 as comprising one delay unit of time.

As with the N-domino chains described above, the delay associated with a signal propagating through P-Domino chain 900 is greater than a single delay unit. In the present implementation wherein chain 900 comprises ten individual domino circuits 901-910 in series, its overall chain delay effectively exaggerates the forward evaluate delay associated with a single one of its component domino circuit by a factor of ten. The pre-discharge time (and foot cutoff) time however is the same for the pre-discharge time of P-domino chain 900 as for its individual domino circuit components 901-910, because the pre-discharge (and cutoff signals) are delivered in parallel thereto.

With reference again to FIG. 8A, a pre-discharge (e.g., in contrast and/or complementary to the precharge state characterizing the N-footed domino circuits, chains and ring described above) occurs when the clocked cutoff PFET device 802 is turned off, as when the clock is high, effectively complementary to the precharge operation of the N-footed domino chains described above. With the pre-discharge PFET 802 off, Inputs are effectively insignificant because their potential paths are in a high impedance state. The high clock at the NFET device 801 turns it on. This charges the dynamic element 803. The half latch 809 functions to reinforce the pre-discharge condition. Thus, if the clock signal disappears, the domino circuit 800 remains in a pre-discharge condition. For low voltage operations, this feature is dispensed with in one embodiment.

FIG. 9B depicts a representation of exemplary chain 900 of P-domino circuits, according to an embodiment of the present invention. In FIG. 9B, for simplicity in describing exemplary embodiments below, domino circuit chain 900 (as described with reference to FIG. 9A) is depicted in a simplified symbolism as a ten unit (e.g., series) logic element having the two inputs 'a' and 'trigger' and two clock marks, one clock for precharge and the other for clocked cutoff.

Exemplary P-Domino Ring Oscillator

Figure 10:
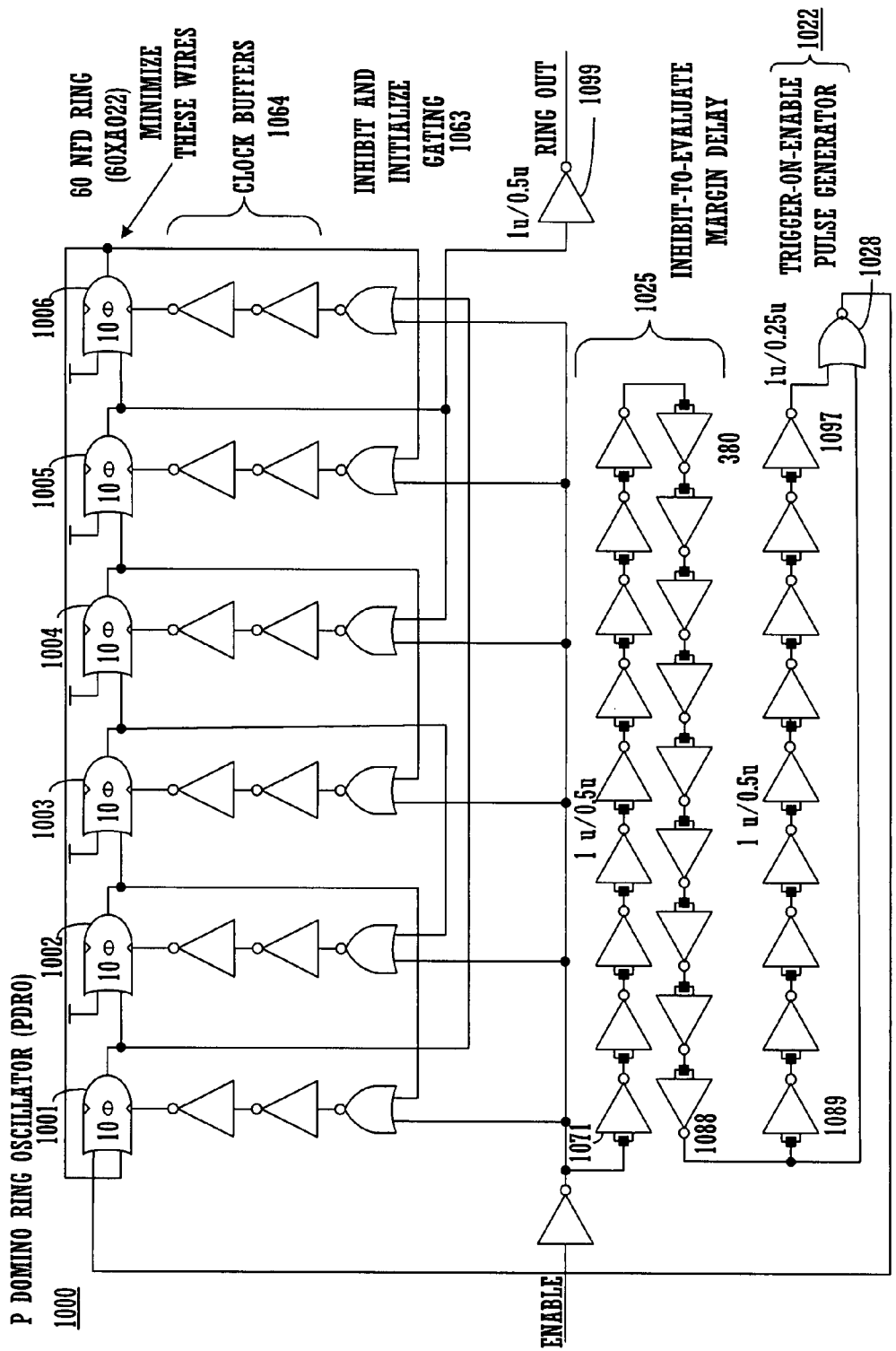
FIG. 10 depicts an exemplary P-Domino ring oscillator, according to an embodiment of the present invention.

FIG. 10 depicts an exemplary P-Domino ring oscillator 1000, according to an embodiment of the present invention. P-Domino ring oscillator 1000 effectively comprises a ring of six domino chains 1001-1006. Other numbers (e.g., numbers beside 6) of domino chains 1000 can be so chained. In the present embodiment, the six domino chains 1001-1006, all of them substantially identical to the domino chain 900 (FIGS. 9A & 9B), are effectively connected together in an simple ring configuration to form oscillating P-domino ring 1000. The operating frequency of ring 1000 can be monitored at any of its outputs. In the present implementation, inverter 1099 buffers the output of domino chain 1005 to comprise the output of ring 1000.

In the present embodiment, the six P-domino chains 1001-1006, all of them substantially identical to the P-footed domino circuit 900 (FIGS. 9A & 9B), are effectively connected together in a simple series configuration to form P-footed domino ring 1000. P-footed domino ring 1000 comprises a complementary circuit to the N-footed domino rings described above (e.g., N-footed domino ring 300; FIG. 3), and operates in a manner substantially complementary to the operation thereof as described above. In the present implementation depicted, P-footed domino ring comprises P-footed domino circuits that can be latched in their pre-discharge condition, and is thus well suited for DC and low frequency operation. In one embodiment, P-footed domino ring 1000 comprises P-footed domino circuits that are configured without half latches and is well suited for low voltage operation.

Exemplary P-Domino Ring Timing Sequence

Figure 11:
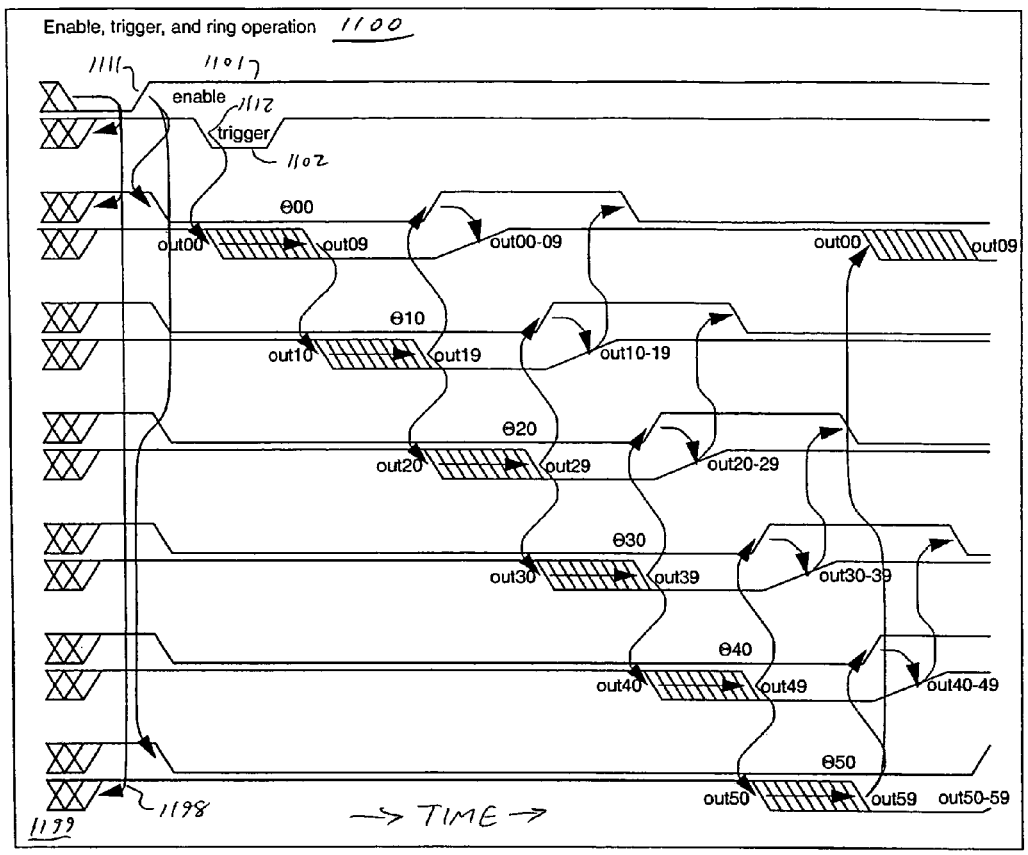
FIG. 11 depicts an exemplary timing sequence for a P-Domino ring oscillator of FIG. 10, according to an embodiment of the present invention.

FIG. 11 depicts an exemplary timing sequence 1100 for a P-Domino ring oscillator, according to an embodiment of the present invention. FIGS. 10 and 11 are discussed simultaneously to describe operations relating to an embodiment of the present invention. P-footed domino ring 1000 comprises a complementary circuit to the N-footed domino rings described above and operates in a manner substantially complementary to the operation thereof as described above. Thus, timing diagram 1100 is substantially complementary to timing diagram 400 (FIG. 4), which relates to the operation of the N-Domino rings.

When the enable signal 1101 is brought low, all of the P-domino circuits in chains 1001-1006 go to their 'pre-discharge' condition. When the enable signals go low and the clocks go high (e.g., through ordinary combinatorial logic), all of the PFET clocked cutoff devices turn 'off' and all NFET pre-discharge devices turn 'on.' The dynamic nodes all go 'low' and are sustained in that condition with half latch 809 (FIG. 8A), e.g., except in embodiments configured for low voltage operation (e.g., in contrast to DC/low frequency operation). When the 'enable' signal goes low, each of the six clock groups Φ00-Φ50 go to the pre-discharge state. As shown in FIG. 10, ring oscillator 1000 effectively comprises a ring of 60 circuits, e.g., the non-inverting domino chains 1001-1006 (each having ten non-inverting domino circuits). Positive feedback unconditionally forces ring 1000 to a state wherein its outputs are all high, in which state it can be latched indefinitely. Latched high, P-domino ring 1000 effectively comprises a storage element having an even number of inverter stages, which will thus not oscillate.

As the enable signal 1101 goes high at rising edge 1111, each of the domino circuits of ring 300 is parked in a 'waiting to evaluate' condition with their dynamic nodes latched low, their clock pre-discharge devices turned off and their clocked cutoff on. The components of ring 1000 comprise domino circuits (e.g., circuits 800, 900; FIGS. 8A-8B, FIGS. 9A-9B, respectively). Where any single domino circuit of ring 1000 evaluates, it forces the next domino circuit of ring 1000 into an evaluate state as well. Thus, where any (e.g., single) input thereof falls low, it will cause its associated dynamic nodes to charge and the output thereof falls low, which comprises a low input to the next stage of ring 1000 and begins a domino cascade in ring 1000.

The cascade of the domino circuits of ring 1000 can be started with the firing of a momentary low pulse to one of the trigger inputs of one of the domino circuits. As discussed above in relation to the N-Domino circuits, trigger pulses can be supplied with any convenient pulse source. For instance, trigger pulses can be supplied to begin oscillation of ring 1000 from an external source. In one embodiment, the domino cascade in ring 1000 is started with a trigger pulse supplied by trigger generator 1022. Pulse generator 1022 functions as an edge detector and operates on the rising edge 1111 of enable signal 1101.

To recap thus far, from undefined region 1199, the enable signal 1101 is brought low and ring 1000 is initialized as all of its P-domino circuits are pre-discharged. Upon pre-discharging, enable signal 1101 is brought high and the domino circuits comprising ring 1000 enter a 'ready to evaluate' condition. After a time delay TD that begins with the enable signal 1101 going high, pulse generator 1022 converts the edge 1111 into a trigger pulse 1102, which fires the trigger input of P-domino chain 1001. The delay TD between the rising edge 1111 of enable signal 1101 and the falling edge 1112 of the trigger signal 1102 corresponds to the delay associated with the operation of a delay chain 1025, comprised of stacked inverters 1071-1088, the operation of which are analogous to and substantially complementary to the operation of delay chain 322 described above (FIG. 3, 4).

Upon the output of segment 1025, e.g., at the output of stacked inverter 1088, the enabled logic gate 1028 fires a trigger pulse 1102 to the trigger input of domino chain 1001, which is parked at that time in its 'waiting to evaluate' condition. Other triggering schemes are used in other embodiments. In another embodiment, pulse trigger 1022 comprises another circuit that imparts an effective inhibit-to-evaluate margin delay function and/or another trigger-on-enable pulse generation function. In yet another embodiment, trigger pulses are provided externally.

At this point, all domino chains of ring 1000, e.g., domino chains 1001-1006, are parked in their 'waiting to evaluate' condition. When a domino circuit in a 'waiting to evaluate' condition is triggered, that domino circuit performs its evaluate function. Thus, upon triggering domino chain 1001, the dynamic nodes of its constituent domino circuits charge and its output falls low. In a sense, the first domino (e.g., domino chain 1001) of ring 1000 "falls" and starts oscillation therein as follows. As domino chain 1001 so falls, its low output is fed back to the input 'a' of domino chain 1002, which is thus forced to evaluate as well.

When domino chain 1002 evaluates, e.g., when "the next domino falls" in ring 1000, its output falls low. The output of domino chain 1002 is fed to input 'a' of domino chain 1003, e.g., the "next" domino chain in ring 1000. Thus, domino chain 1003 is forced to evaluate, whereupon its output falls low. Yet another domino of ring 1000 falls. Analogous to the action described above in relation to the operation of N-domino ring 300 (FIG. 3, 4), this action continues around ring 1000 until all of the dominos of ring 1000 have thus fallen. The output of domino chain 1006 is fed to the input 'a' of domino chain 1001, completing a first domino cascade in ring 1000. Further, the output of domino chain 1005 is buffered by inverter 1099. The output of inverter 1099 comprises the output of ring 1000.

The sequence of operation in ring 1000 can be synopsized as follows. In undefined region 1199, inputs to ring 1000 lacked significance. Upon initialization 1198, the enable signal 1101 went low. All domino circuits of ring 1100 thus went to their pre-discharge condition and their outputs went high. When the enable signal 1101 went high, all domino circuits of ring 1000 went to their ready-to-evaluate condition and waited for a trigger. Upon firing the trigger pulse 1102, the first of the domino circuits of ring 1000 falls, e.g., domino chain 1001 evaluates and causes the other domino circuits of ring 1000 to, in succession, evaluate and cause the next domino chain in the ring to evaluate.

More specifically, the sequence of operation in ring 1000 can be described as follows thus far. The falling edge 1112 of trigger pulse 1102 causes output 00 (e.g., of the first domino circuit of ten-domino circuit chain 1001) to fall low, which causes the next nine outputs 01-09 to fall low. The fall of output 09 in turn causes the domino circuits comprising the next domino chain in ring 1000 to fall. Thus outputs 10-19 fall. These in turn cause the next domino circuits comprising the next domino chain in ring 1000 to fall. Thus outputs 20-29 fall. These in turn cause the next domino circuits comprising the next domino chain in ring 1000 to fall. Thus outputs 30-39 fall. These in turn cause the next domino circuits comprising the next domino chain in ring 1000 to fall. Thus outputs 40-49 fall. These in turn cause the next domino circuits comprising the next domino chain in ring 300 to fall. Thus outputs 50-59 fall.

At this point, all the dominos of ring 1000 have fallen. All outputs are low, and an even number of inversions has occurred around loop 1000, which is thus again in a stable state, in which it can be latched e.g., for DC/low frequency operation (but not for low voltage operation). No oscillating action has yet occurred in ring 1000. However, the outputs of each of domino chains 1001-1006 is periodically tapped and fed back to the clocking gate 1063 associated with one of the domino chains at an "earlier" position in ring 1000. Thus, after a group of domino circuits (e.g., domino chain 1001, etc.) has fallen, its output is fed back with a clock to a "previous" set of domino circuits.

The output of domino chain 1001 for instance is fed back to the inhibit and initialize gate 1063 associated with domino chain 1006. The output of domino chain 1006 for instance is fed back to the gate 1063 associated with domino chain 1005. The output of domino chain 1005 for instance is fed back to the gate 1063 associated with domino chain 1004. The output of domino chain 1004 for instance is fed back to the gate 1063 associated with domino chain 1003. The output of domino chain 1003 for instance is fed back to the gate 1063 associated with domino chain 1002. And in the present exemplary implementation, the output of domino chain 1002 is fed back to the inhibit and initialize gate 1063 associated with domino chain 1001.

Thus, after one group of dominos (e.g., domino chain 1001) has fallen, its output is used to feed back to a gate 1063 associated with a previous set of dominos (e.g., domino chain 1006), which upon a clock thereto puts that associated set back into a pre-discharge condition. Upon pre-discharging that associated domino set, the clock is switched back to a ready-to-evaluate condition. The rate of signal propagation around ring 1000 is related to (e.g., dependent on, proportional to, etc.) the forward evaluate time of the ring, e.g., the time it takes to evaluate an input, e.g., to generate an output corresponding thereto. However, before the evaluation "returns" to the same point in ring 1000, another component circuit of the ring has already pre-discharged the domino circuit at that point.

Thus, the domino chains' fall and the evaluating continues indefinitely around the ring, substantially unabated, establishing an oscillation therein. Importantly, ring 1000 thus comprises an effective ring oscillator having a number of non-inverting stages, each comprising dynamic circuits. Further, ring 1000 uses effectively self-resetting logic signals to perpetuate its oscillation. The outputs of each component domino chain of ring 1000 feed back to a stage at some point previous in the ring (e.g., one or more positions earlier). In the present embodiment, the outputs of each component domino chain of ring 1000 feed back one stage earlier in ring 1000. However, ring 1000 can be implemented with the outputs of each of its component domino chains fed back to a stage at any point selected that is previous in the ring to the outputting stage.

Thus, the trigger pulse effectively causes outputs 00-09 to fall low. This effect is perpetuated for outputs 20-29, etc. through 50-59. The output 29 is brought back up to the $\Phi10$ clock (e.g., input to gate 1063 therewith) and is used to bring $\Phi10$ high. (In a similar way, output 19 has a similar affect with $\Phi00$, etc.) The $\Phi10$ then remains high until output 29 is pre-discharged, at which point $\Phi10$ returns to a low condition.

Importantly, like the N-domino rings discussed above, P-domino oscillating ring 1000 has a number of non-inverting stages and uses logic signals of components thereof to reset stages situated earlier in the ring, without additional pulse generators. Outputs of the stages comprising ring 1000 are fed back to previous stages in the ring. While ring oscillator 1000 can conveniently be triggered with an edge detector, pulse generator, etc. represented by pulse generator 1022, it should be appreciated that ring oscillator can function without edge detecting and other pulse generators; even operating with externally provided triggering. Ring oscillator 1000 comprises a dynamic oscillator that uses a level sensitive completion signal to precharge an upstream stage. In these implementations using predominantly PFET devices, the pre-discharge condition is analogous to a 'reset' condition of precharge condition in N-domino circuits.

Considering a stage N of ring 1000 whose output comprises a completion signal, its output can be fed back an indefinite number of stages J to a stage that responds to the level of the feedback signal, in contrast to its edge. No trigger pulse is needed to sustain oscillation of ring 1000 once it is triggered. Once enabled, ring 1000 can be triggered by pulse generator 1022 or externally, e.g., with a user supplied trigger pulse. Importantly however, no particular trigger circuit is required for the oscillation of ring 1000 within its dynamic circuits.

Exemplary Comparison System and Process

The frequency ($F_{DRO}$) of the P-domino and N-domino ring circuits (DRO) described herein effectively comprises the reciprocal of the delay period around the ring. Thus, $$F_{DRO}=1/\text{Delay Period}_{Ring} \quad \text{(Equation 1).}$$

The delay period around the rings described herein has two component delays, one associated with its dynamic stages and the other with its static stages. The dynamic stage delay component will often be significantly longer than the relatively small delay component associated with the static circuits.

The buffer stage (e.g., output inverters 106 & 806; FIGS. 1A & 8A, respectively) is implemented in one embodiment such that has a significant (e.g., substantial) size with respect to the dynamic stage (e.g., devices 103 & 803; FIGS. 1A & 8A, respectively). In the present embodiment, the buffer stage places a significant load on the relatively slowly switching dynamic stage of the ring and the buffer's large size relative to the dynamic stage switches the dynamic stage readily.

In one embodiment therefore, the most significant portion of delay in the domino circuits described herein is related to (e.g., depends upon, is influenced by, etc.) the time it takes for the active transistor (e.g., FET) devices to discharge their dynamic load. In a predominantly N-domino circuit, the output frequency is thus proportional to the "strength" of its constituent NFET evaluation devices. Likewise, in a predominantly P-domino circuit, the output frequency is proportional to the strength of its constituent PFET evaluation devices. N-domino circuits (e.g., N-domino ring oscillator 300; FIG. 3) also comprise some PFET devices (e.g., PFET 101; FIG. 1A) and vice versa, e.g., complementarily, P-domino circuits also comprise some NFETs. Thus, the output frequency of an N-domino oscillator is related to the strength of its constituent NFETs in proportion to its constituent PFETs and vice versa.

Figure 12A:
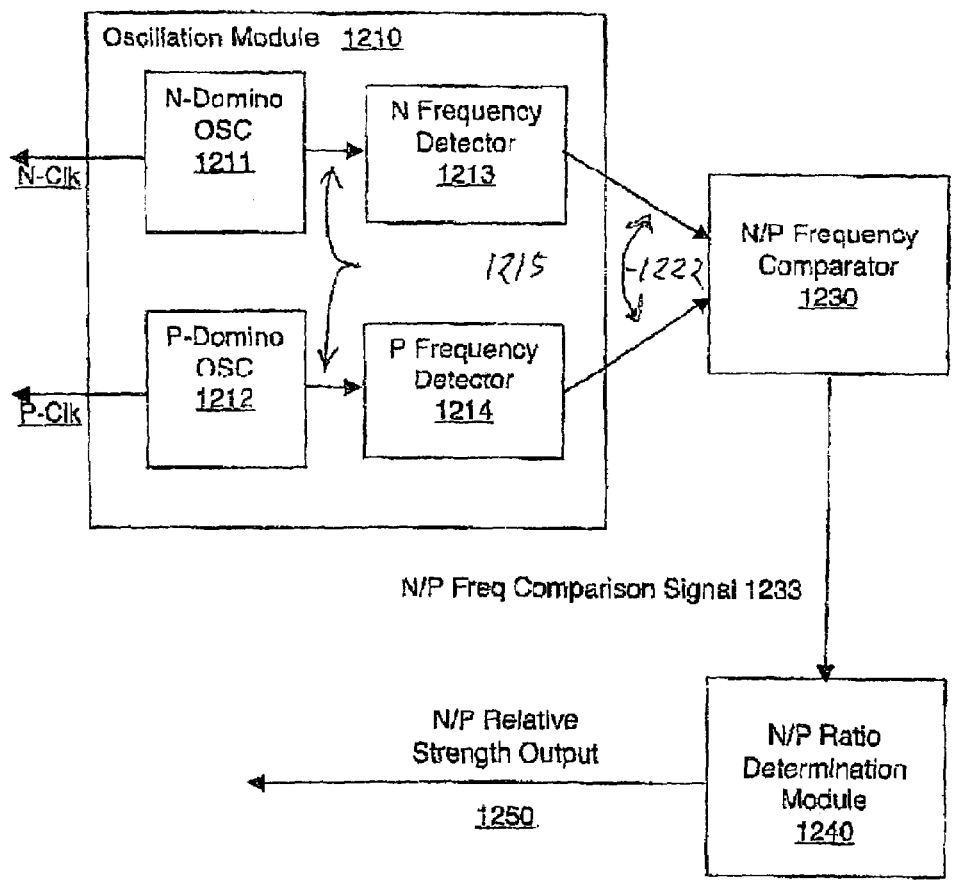
FIG. 12A depicts an exemplary system for effectively determining the relative strengths of constituent P-type and N-type devices, according to an embodiment of the present invention.
Figure 12B:
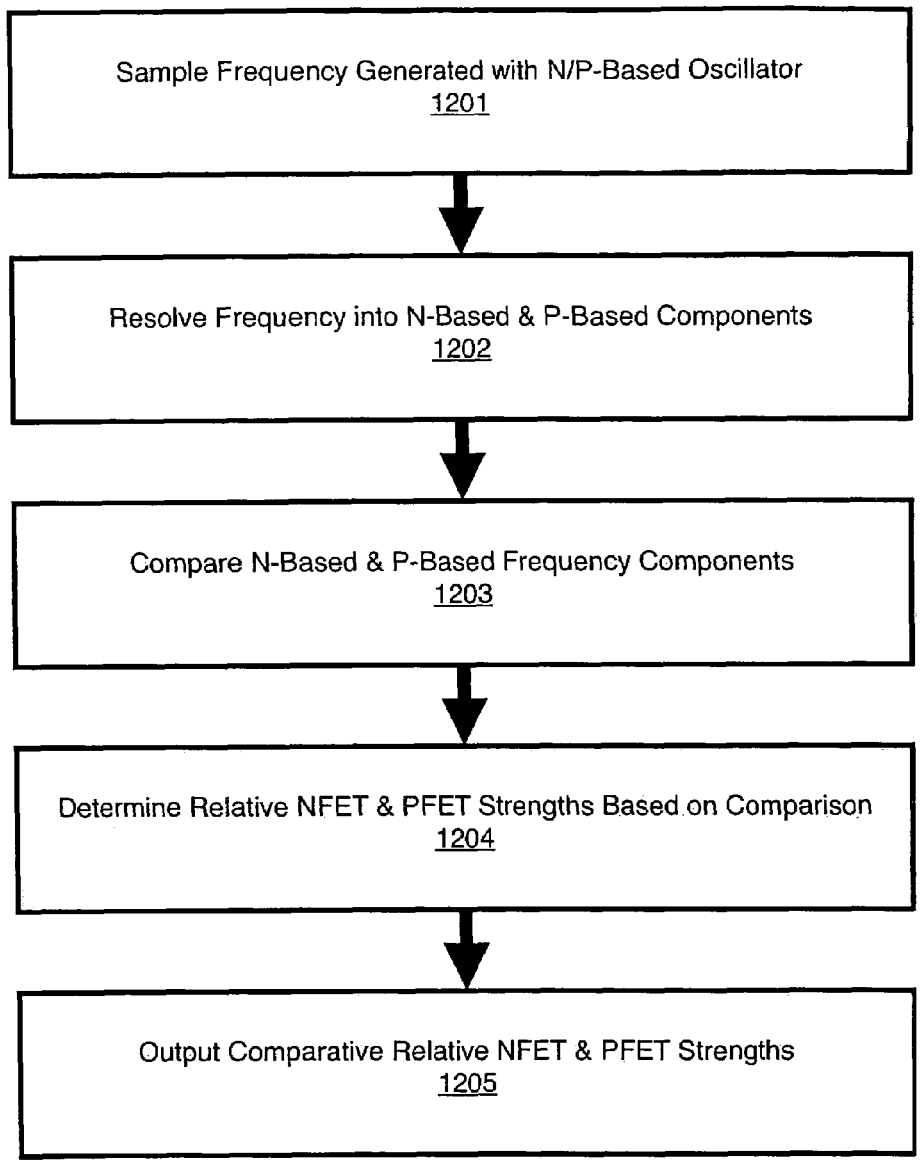
FIG. 12B depicts a flowchart of a process for effectively determining the relative strengths of constituent P-type and N-type devices, according to an embodiment of the present invention.

FIG. 12A depicts an exemplary system 1200A for effectively determining (e.g., measuring, calculating, ascertaining, etc.) the relative strengths of constituent P-type and N-type devices, according to an embodiment of the present invention. FIG. 12B is a flowchart of a process 1200B for effectively determining the relative strengths of constituent P-type and N-type devices, according to an embodiment of the present invention. For clarity and brevity, FIGS. 12A and 12B are described together.

An oscillating module 1210 comprises a pair of substantially complementary oscillators, one substantially NFET based and the other substantially PFET based. In one embodiment, oscillator 1211 comprises an N-domino oscillator (e.g., N-ring oscillator 300; FIG. 3). The output of N-domino oscillator 1211 is coupled to an N frequency detector 1213. The output of P-domino oscillator 1212 is coupled to a P frequency detector 1214. The frequency of the oscillating outputs 1215 is related to the relative strengths of the NFET and PFET components of oscillators 1211 and 1212. The frequencies of oscillating outputs 1222 are compared by N/P frequency comparator 1230. The frequency comparison is used by N/P ratio determiner 1240 to determine the relative N/P strengths.

Process 1200B begins with block 1201, wherein a frequency generated with an oscillator having both N-based and P-based components is sampled, e.g., at an output thereof (e.g., outputs 1215). In block 1202, N-based and P-based frequency determination is performed. In block 1203, N/P frequency comparator 1230 compares the frequencies of oscillating outputs 1222. Based on its comparison, N/P frequency comparator 1230 generates a corresponding N/P frequency comparison signal 1233.

In block 1204, the results of the N/P frequency comparison are used to determine the relative NFET/PFET strengths. N/P frequency comparison signal 1233 is input to N/P ratio determination module 1240. N/P ratio determination module 1240 determines (e.g., calculates, applies a process, an algorithm, etc., decides, ascertains, etc.) the relative NFET/PFET strengths of the sources (e.g., N-domino oscillator 1211 and P-domino oscillator 1212) of oscillating outputs 1215. The relative frequency content of oscillating outputs 1215 is examined and the relative strength of their dynamic sources, either N-type or P-type is deduced or induced therefrom.

Upon determining the relative NFET/PFET strengths, N/P ratio determination module 1240 outputs a corresponding N/P relative strength output signal 1250. In block 1205, the relative NFET/PFET strengths are output, completing process 1200B. Process 1200B can be performed with fewer steps. For instance, where the process comprises a function, e.g., inherent, in the operation of a system in which the oscillator is disposed, embedded, etc., in one embodiment, sampling of the frequency is obviated. Similarly, where the process is performed with a system functional to determine its own inherent relative N-based/P-based strength, in one embodiment outputting is obviated.

System 1200A and process 1200B function with both DC/low frequency circuits and low voltage circuits, e.g., latched and unlatched circuits, as described above. Conventionally, analog circuits are typically used for determining relative N/P strength. However, typical analog circuits may not operate efficiently in at very low voltage applications, although determining the relative N/P strength therein is desirable. Advantageously, the circuits described herein operate efficiently at voltages low enough to be useful in applications where conventional analog N/P strength determination techniques may be inefficient. The circuits described above that function without latching (e.g., N-domino based circuits 500, 600, 700; FIGS. 5A-5B, 6A-6B, and 7, respectively and their unlatched P-based complements), operate at very low voltages (e.g., ultra-low Vmin operation). Thus, they provide the benefit of allowing determination of their relative N/P strengths without resort to conventional analog circuits.

In summary so far, Section I describes above exemplary embodiments including circuits, systems and methods relating to a dynamic ring oscillator. A dynamic oscillating ring circuit has multiple non-inverting domino circuits, each having a signal input, a trigger input, inputs for charge state and cutoff clocks and an output inverter. A number of the domino circuits are coupled in series, the output of one feeding the input of the next, to form a chain, which form stages of the ring. A number of the stages are coupled in series, the output of one feeding the input of the next, to form the ring. The first domino circuit of said chain receives a logic signal input and a single trigger input for the chain. Within the ring, the output of each stage feeds the input signal to the next stage and is fed back to clock an earlier stage to allow the ring to oscillate.

Section II

Circuits, Systems and Methods Relating to a Dual Dynamic Ring Oscillator

Embodiments of the present invention relate to circuits, systems and methods relating to a dual dynamic ring oscillator. The circuits, systems and methods of the present invention can be implemented in a variety of different dynamic ring oscillators. The description herein in Section I above describes exemplary dynamic ring oscillator circuits, systems and methods, and thus represents a discussion of an exemplary platform with which embodiments of the present invention can be practiced, e.g., circuits, systems and methods relating to a dual dynamic ring oscillator. It should be appreciated however that embodiments of the present invention may also be practiced with other dynamic ring oscillator circuits, systems and methods.

Exemplary Dual Footed Domino Circuit Stage

FIG. 13 depicts an exemplary dual footed domino circuit stage 1300, according to an embodiment of the present invention. Dual footed domino stage 1300 has a complex, active first stage 1305 and an output buffer stage 1303. Buffer stage 1303 is latched with a feedback latch 1309.

Feedback latch 1309 has a half latch pull-up section 1318 and a half latch pull-down section 1319. Pull-up section 1318 has three PFETs coupled in series between supply voltage Vdd and the input to inverting output buffer 1306. Pull-down section 1319 has three NFETs coupled in series between the input to inverting output buffer 1306 and ground. All six transistors comprising sections 1318 and 1319 are gated together in parallel from the output of inverter 1306.

The complex active stage 1305 comprises a five state driver with an N-domino dynamic stage 1301 and a P-domino based dynamic stage 1302. In one embodiment, the operation of each of dynamic stages 1301 and 1302 is substantially similar to the operation of the domino circuits described in Section I above, such as N-domino circuit 100 (FIG. 1A, 1B) and P-domino circuit 800 (FIG. 8A, 8B), respectively.

N-domino stage 1301 has a clocked cutoff device 1331 and a precharge clock device 1335. Logic input 'a' is input to N-domino stage (e.g., in parallel with P-domino stage 1302) at device 1333. Its trigger is input to N-domino stage 1301 at NFET 1341. N-domino stage 1301 comprises a dynamic stage that is fully capable of driving the output buffer stage 1303.

P-domino stage 1302 has a clocked cutoff device 1332 and a pre-discharge clock device 1336. Logic input 'a' is input to P-domino stage (e.g., in parallel with N-domino stage 1301) at device 1334. Its trigger is input to P-domino stage 1302 at PFET 1342. Like N-domino stage 1301, P-domino stage 1302 comprises a dynamic stage that is fully capable of driving the output buffer stage 1303.

The five states of operation characterizing dual footed domino stage 1300 include precharge-N, evaluate-N, pre-discharge-P, evaluate-P, and a "do nothing" state. The "do nothing" state comprises a high impedance state, wherein the output buffer 1306 simply "keeps" itself, e.g., is latched in a stable state. With all drivers off, the dual footed domino circuit 1300 holds its last state. Thus, dual footed domino circuit 1300 effectively comprises an output buffer stage 1303 driven by a five state driver, e.g., complex active stage 1305. In one embodiment, dual footed domino stage 1300 comprises a synthesis (e.g., effectively achieves functional synthesis of) of domino circuits 100 and 800 (FIG. 1A-1B, 8A-8B), described in Section I above.

Dual footed domino circuit 1300 has several shared nodes between each of its active sections 1301 and 1302, which include logic signal input 'a', the dynamic nodes within complex active stage 1305, and the input and output of inverting buffer 1306. In one embodiment, all transistors of dual footed domino circuit 1300 are kept (e.g., are latched in a stable state). Advantageously, N-domino stage 1301 and P-domino stage 1302 share inverting buffer 1303 and are each fully capable of driving it, thus obviating a separate output buffer for each. This has benefits relating to simplification, economy, etc. Dual footed domino circuit 1300 can operate as either an N-domino circuit or a P-domino circuit, according to the inputs received thereby.

FIG. 13B also depicts exemplary dual footed domino circuit 1300, according to an embodiment of the present invention. In FIG. 13B, for simplicity in describing exemplary embodiments below, dual footed domino circuit 1300 (as described with reference to FIG. 13A) is depicted in a simplified symbolism as a logic unit having the three inputs 'a', 'N-trigger' and 'P-trigger' and four clock marks, clock NC for precharge, clock PC for pre-discharge, and N and P foot cutoffs NF and PF.

Exemplary Dual Footed Domino Chain

Figures 14A, 14B:
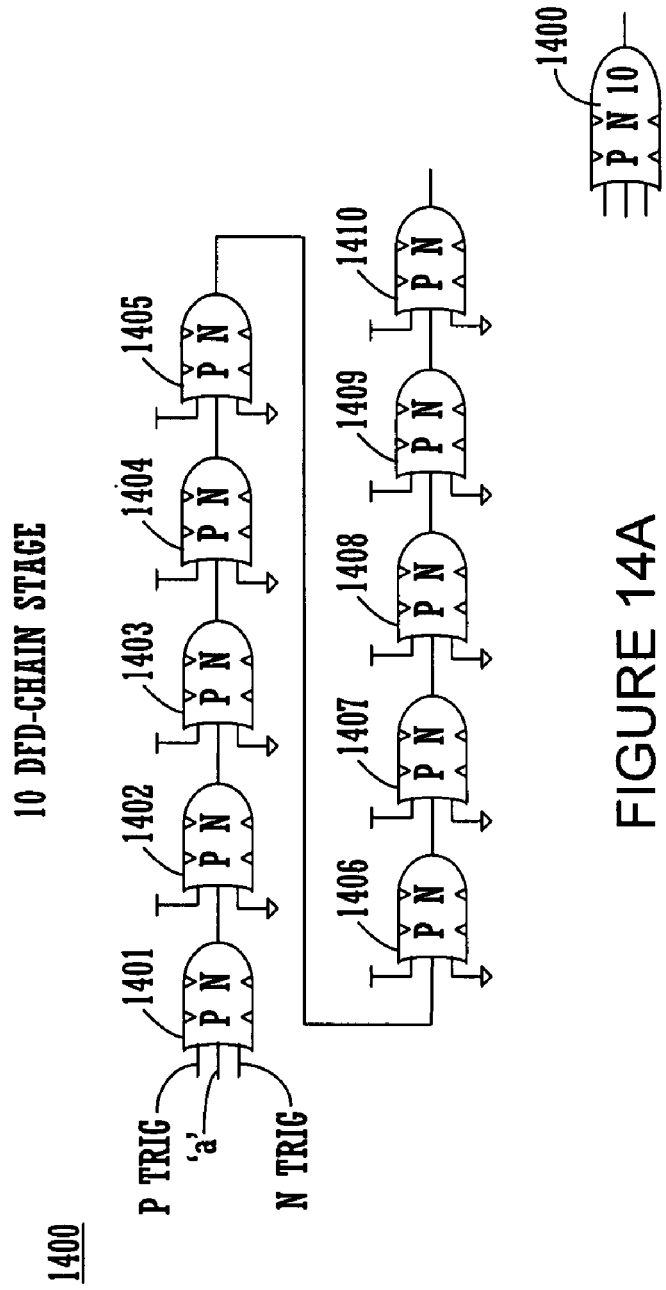
FIGS. 14A and 14B respectively depict a diagram and a representation of exemplary chain of dual footed domino circuits, according to an embodiment of the present invention.

FIG. 14A depicts an exemplary chain 1400 of ten dual footed domino circuits 1401-1410, according to an embodiment of the present invention. Other numbers (e.g., numbers beside 10) of dual footed domino circuits can be so chained. In the present embodiment, the ten domino circuits 1401-1410, all of them substantially identical to the domino circuit 1300 (FIGS. 13A & 13B), are effectively connected together in a simple series configuration to form chain 1400. In one embodiment, dual footed domino chain 1400 effectively achieves functional synthesis of domino chains 200 and 900 (FIGS. 2A-2B, 9A-9B), described in Section I above.

The input 'a' and the N and P trigger signals are available to dual domino circuit 1401, e.g., the first domino circuit in chain 1400. The output of dual domino circuit 1401 effectively comprises the analog of the input 'a' for the subsequent dual domino circuit 1402 in chain 1400. The trigger inputs for dual domino circuit 1402 however are effectively disabled e.g., by grounding the N-trigger input and connecting the P-trigger input to Vdd, as they are for the other dual domino circuits 1403-1410 downstream there from. The N-precharge, P-pre-discharge and N and P foot cutoff clocks are fed to all of dual domino circuits 1401-1410 in parallel. Thus, the dual domino circuits 1401-1410 are clocked effectively simultaneously.

Each dual domino circuit stage (e.g., dual domino circuits 1401-1410) of chain 1400 has a certain delay associated with its evaluation operations, e.g., with outputting logic responses based upon receiving inputs. For simplicity and brevity in discussing this delay herein, it is convenient to consider the exemplary delay associated with a single dual domino circuit in chain 1400 as comprising one delay unit of time.

The delay associated with a signal propagating through chain 1400 is greater than a single delay unit. In the present implementation wherein chain 1400 comprises ten individual dual domino circuits 1401-1410 coupled in series, its overall chain delay effectively exaggerates the forward evaluate delay associated with a single one of its component dual domino circuits by a factor of ten. The precharge and pre-discharge times (and N and P foot cutoff times) however are the same for chain 1400 as for its individual dual domino circuit components 1401-1410, because the precharge and pre-discharge (and N and P cutoff signals) are delivered in parallel thereto.

FIG. 14B also depicts exemplary chain 1400 of dual-domino circuits, according to an embodiment of the present invention. In FIG. 14B, for simplicity in describing exemplary embodiments below, domino circuit chain 1400 (as described with reference to FIG. 2A) is depicted in a simplified symbolism as a ten unit (e.g., series) logic element having the three inputs 'a', the 'N-trigger' and 'P-trigger' and four clock marks for precharge, pre-discharge, and N and P foot cutoffs.

Exemplary Delay Chain

Figure 15A:
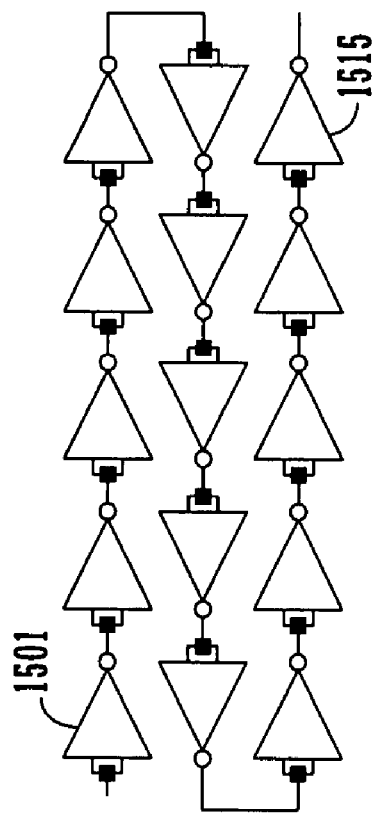
FIGS. 15A and 15B respectively depict a diagram and a representation of an exemplary delay chain, according to an embodiment of the present invention.
Figure 15B:
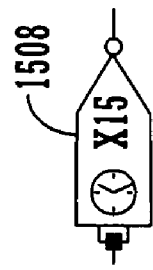

FIG. 15A depicts an exemplary delay chain 1500, according to an embodiment of the present invention. In one embodiment, delay chain 1500 comprises a series of stacked inverters 1501-1515, as described above in Section I (e.g., delay chain 325 of stacked inverters 371-388; FIG. 3). While in the present implementation fifteen stacked inverters are used, delay chain 1500 can also be implemented using other numbers of stacked inverters or other delay elements. FIG. 15B also depicts delay chain 1500, according to an embodiment of the present invention. In FIG. 15B, for simplicity in describing exemplary embodiments below, delay chain 1500 (as described with reference to FIG. 15A) is depicted in a simplified symbolism as a fifteen unit (e.g., series) inverter element.

Exemplary Trigger Circuit and Signals

Figure 16A:
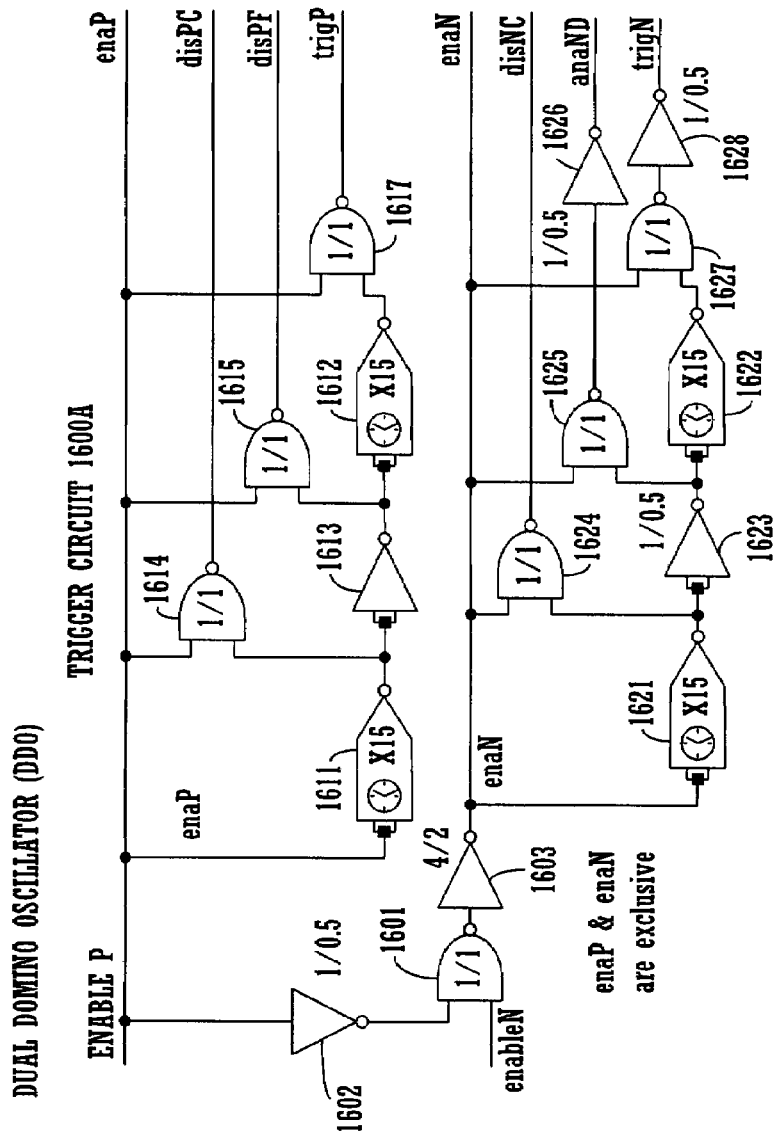
FIGS. 16A and 16B respectively depict a trigger circuit and signals, according to an embodiment of the present invention.
Figure 16B:
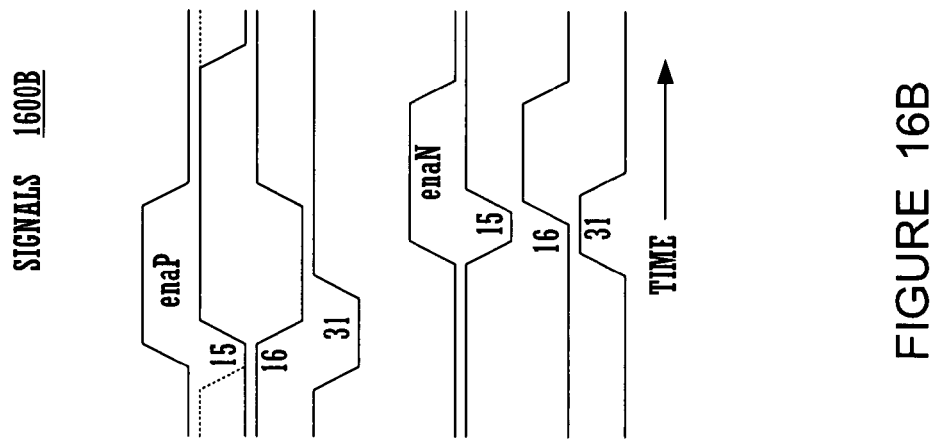

FIG. 16A depicts an exemplary trigger circuit 1600A for a dual dynamic ring oscillator circuit, according to an embodiment of the present invention. FIG. 16B depicts exemplary signals 1600B generated with trigger circuit 1600A, according to an embodiment of the present invention. For clarity and brevity, FIGS. 16A and 16B are described together. In one embodiment, the delay chains discussed in relation to trigger circuit 1600A comprise stacked inverters substantially similar to those described with reference to FIGS. 15A and 15B above. Signals 1600B comprises an initialization timing diagram for the dual dynamic ring circuit described below.

An enable-N signal 'enable-N' is input to gate 1601 with an inverted enable-P signal 'enable-P', provided to another input of gate 1601 via inverter 1602. The output of gate 1601 is buffered by inverter 1603 and resulting signal enaN is input to delay chain 1621, which in one embodiment comprises 15 stacked inverters. The enable-P signal 'enable-P' provides signal 'enaP' directly without further logic and is input to delay chain 1611, which in one embodiment comprises 15 stacked inverters. Logic gates 1601-1603 ensure that enaN and enaP are mutually exclusive and therefore N-domino and P-domino operations are mutually exclusive.

The output of delay chain 1621 is buffered with inverter 1623 and input to delay chain 1622 comprising in one embodiment comprise 15 stacked inverters, which exaggerates (e.g., magnifies, increases, etc.) the delay introduced with delay chain 1621. The output of delay chain 1622 is input with signal enaN to gate 1627, the output of which is buffered with inverter 1628 to comprise the N-trigger.

The output of delay chain 1621 is input with signal enaN to gate 1624 to generate a corresponding N-clock disable signal 'disNC'. The inverted output of delay chain 1621 is input with signal enaN to gate 1625, the output of which is buffered with inverter 1626 to generate a corresponding N-foot enable signal 'enaNF'.

Signal 'enap' is input to delay chain 1611. The output of delay chain 1611 is buffered with inverter 1613 and input to delay chain 1612 comprising in one embodiment comprise 15 stacked inverters, which exaggerates the delay introduced with delay chain 1611. The output of delay chain 1612 is input with signal enaP to gate 1617, the output of which comprises the P-trigger.

The output of delay chain 1611 is input with signal enaP to gate 1614, the output of which comprises P-clock disable signal 'disPC'. The inverted output of delay chain 1611 is input with signal enaP to gate 1615 to generate a corresponding P-foot disable signal 'disPF'.

As seen in the signal traces 1600B, signals enaN and enaP are effectively complementary with respect to timing, as respectively are signals disPC and disNC, signals disPF and enaNF, and the N and P triggers. This advantageously prevents crowbar action in the dual domino oscillator circuits discussed below.

Exemplary Dual Domino Ring Oscillator Circuit

Figure 17:
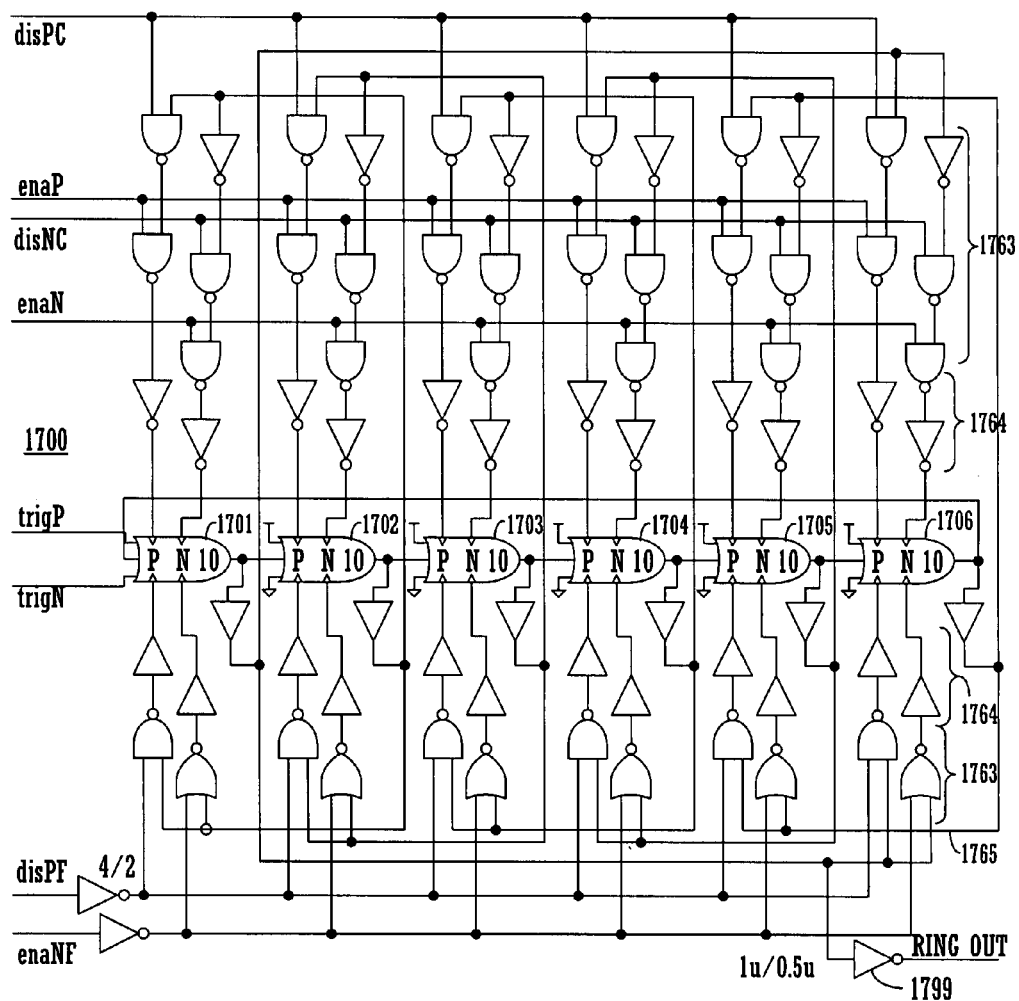
FIG. 17 depicts an exemplary dual domino ring oscillating circuit, according to an embodiment of the present invention.

FIG. 17 depicts an exemplary dual domino oscillator circuit 1700, according to an embodiment of the present invention. Dual domino ring oscillator 1700 effectively comprises a ring of six dual domino chains 1701-1706. Other numbers (e.g., numbers beside 6) of dual domino chains 1700 can be so chained. In the present embodiment, the six dual domino chains 1701-1706, all of them substantially identical to the dual domino chain 1400 (FIGS. 14A-14B), are effectively connected together in a simple ring configuration to form oscillating dual domino ring 1700. The operating frequency of ring 1700 can be monitored at any of its outputs. In the present implementation, inverter 1799 buffers the output of domino chain 1701 to comprise the output of ring 1700.

All around the ring 1700, the input 'a' of any of chains 1701-1706 effectively comprises the output of the chain immediately preceding it in the dual domino ring 1700. Bearing in mind the ring configuration of dual domino oscillating ring 1700, it may be convenient at least graphically to think of the output of chain 1706 as that of the "last" stage in ring 1700 as drawn. In that sense, the output of chain 1706 can be thought of as being "fed back" to the input 'a' of the "first" stage 1701. The N-trigger input of all the chains except one (e.g., chain 1701) are effectively disabled (e.g., to ground). Complementarily, the P-trigger input of all the chains except one (e.g., chain 1701) are effectively disabled (e.g., to Vdd).

In the present implementation, chain 1701 is triggered by a pulse generator 1600A. Inhibit and initialization functions of the domino chains 1701-1706 are controlled by their respective gates 1763 through buffers 1764. Gates 1763 operate with signals disNC, disPC, disPF and enaNF and deter crowbar action in dual domino ring 1700, by ensuring that the P-domino components of dual domino ring 1700 are shut down when its N-domino components are actively operating, and vice versa.

Importantly, the outputs of dual domino chains 1701-1706 are tapped periodically and fed back as effective completion signals to previous (e.g., earlier) stages in dual domino ring 1700, analogous to the operation described in Section I above in relation to the operation of domino ring circuit 300 (FIG. 3) and the others.

In the domino circuits described in Section I above, the N-domino circuits operate in either precharge or awaiting evaluation states. In precharge, the foot devices are off, the precharge clock is on and the N-domino circuit is effectively thus forced into precharge. In evaluate, the clock is shutoff and the foot devices are active but not necessarily. "doing anything." In fact, the N-domino is sensitive in this state to the input 'a', e.g., the logic signal input. Thus, while waiting to evaluate, the N-domino dynamic stage is high impedance and the N-domino device effectively keeps its state. In precharge however, the N-domino device is hard driven into precharge. A complementary state of affairs exists in relation to the P-domino circuits described above.

Dual domino ring circuit 1700 has N-domino circuit components and P-domino components. Control of dual domino ring circuit 1700 operation is somewhat more complex than control of the simpler domino circuits described in Section I above. The clock logic of dual domino ring circuit 1700, trigger circuit 1600A and clock and control signals 1600B function to shut down the N-domino precharge devices when operating the P-domino components and to shut down the P-domino pre-discharge devices when operating the N-domino components. Dual domino ring 1700 uses four completion logic chains 1765 for each of the N and P domino stages 1701-1706.

Operation of dual domino ring 1700 is enabled with a trigger pulse. Signal disPC is low long enough to pre-discharge the P-domino circuits and the P trigger pulse firing causes dual domino ring 1700 to P oscillate. Complementarily, disNC is low long enough to precharge the N-domino circuits, wherein the N trigger pulse creates N oscillation in dual domino ring 1700.

Exemplary Timing Sequences

Figure 18A:
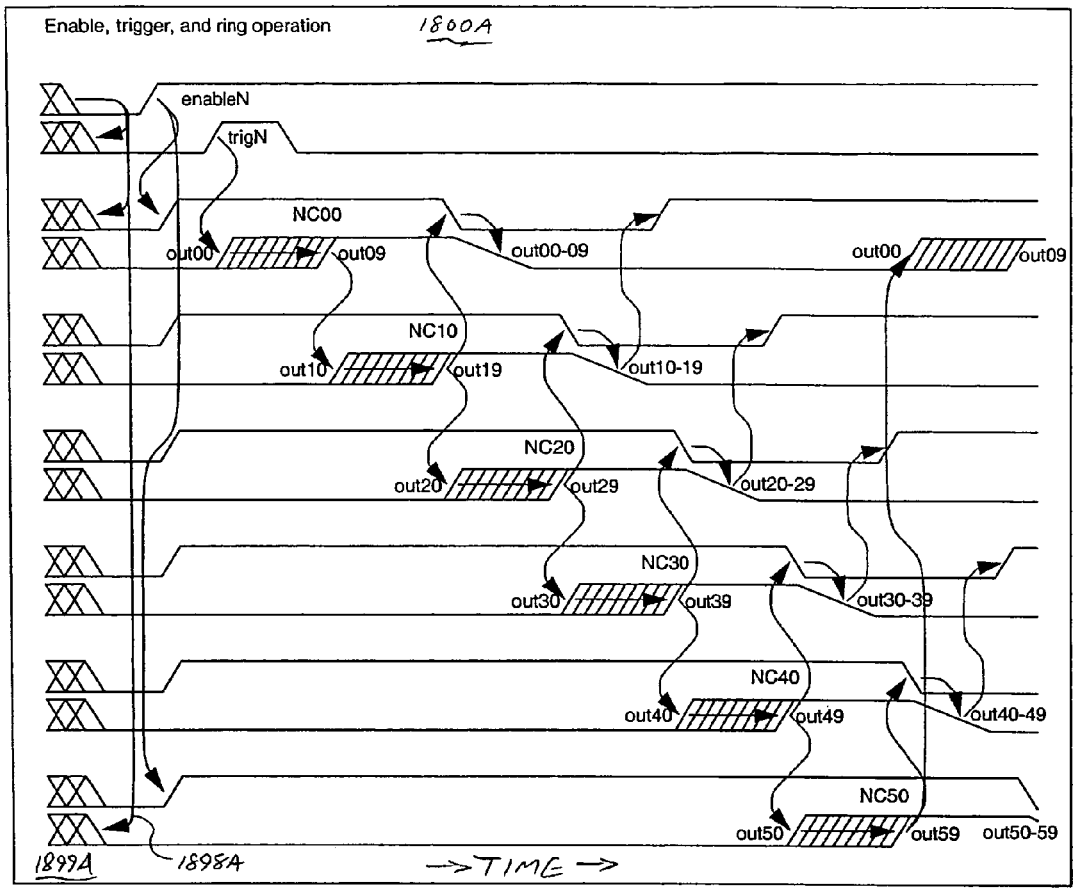
FIGS. 18A and 18B depict exemplary timing sequences associated with a dual domino ring oscillating circuit of FIG. 17, according to an embodiment of the present invention.
Figure 18B:
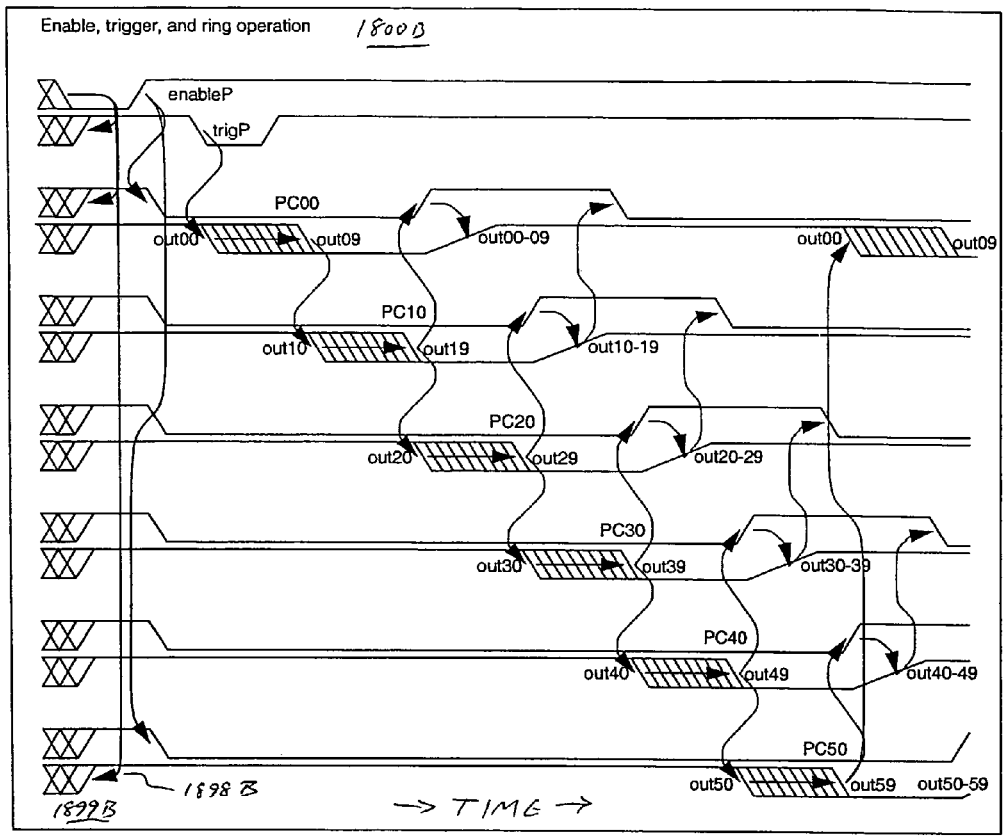

FIGS. 18A and 18B depict exemplary timing sequences 1800A and 1800B for dual domino ring oscillator 1700, according to an embodiment of the present invention. FIGS. 17, 18A and 18B are discussed together to describe operations relating to an embodiment of the present invention. Regions 1899A and 1899B (crosshatched), at the far left of timing diagrams 1800A and 1800B, comprises undefined regions, wherein any inputs effectively lack significance. The N-domino circuits are initialized at event 1898A and the P-domino circuits are initialized at event 1898B. The substantially complementary features of timing diagrams 1800A and 1800B respectively relate to the N-domino components and the P-domino components of dual domino ring circuit 1700 and are substantially similar to the timing diagrams respectively described in Section I above (e.g., timing diagrams 400, 1100; FIG. 4, 11, respectively) in relation to operation of N-domino ring oscillators and P-domino ring oscillators. Control distinctions exist between the operation of dual dynamic ring circuit 1700 and the operating and timing sequences described in Section I above. Such control distinctions relate to preventing crowbar operation of dual dynamic ring circuit 1700, e.g., to preventing simultaneous operation of its N-domino circuits and chain stages and its P-domino circuits and chain stages.

Importantly, oscillation is sustained in dual domino ring circuit 1700 with sequentially propagating level sensing and self-generated completion signals, as described in Section I above (e.g., in relation to domino ring circuits 300, etc.; FIG. 3, etc.). For instance, each of dual domino chain stages 1701-1706 of ring 1700 is fed the output of a previous dual domino stage as its own logic input, and the outputs of one dual domino chain stage of the ring is fed back to the initiate gating 1763 and 1764 of a previous stage.

Exemplary Low Voltage Dual Domino Ring Oscillator

Figures 19A, 19B:
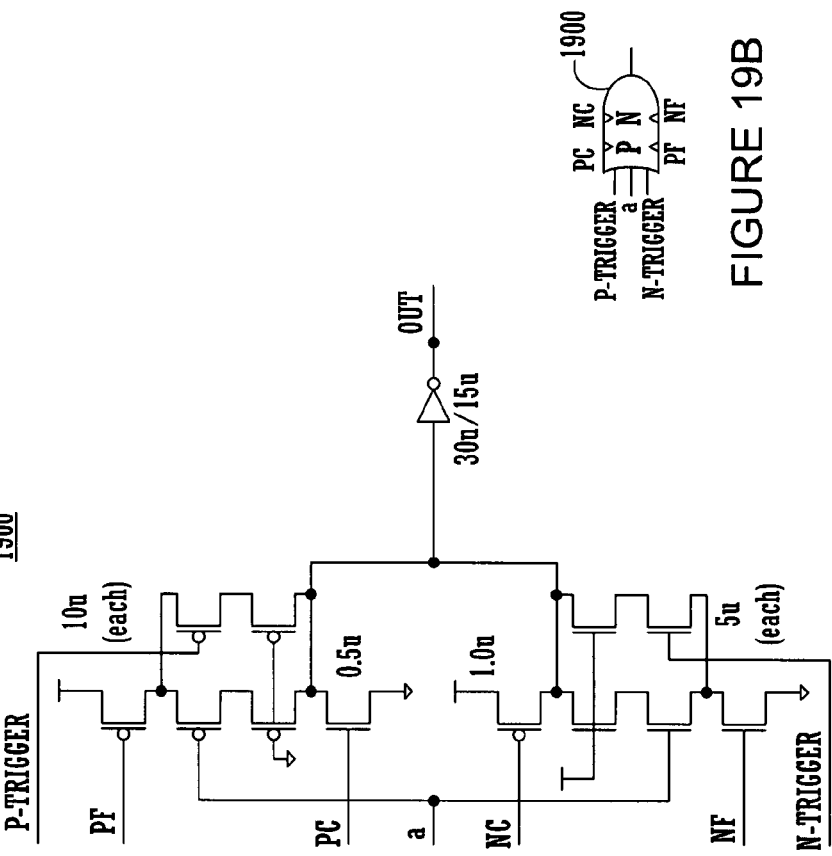
FIGS. 19A and 19B respectively depict a diagram and a representation of an exemplary unlatched dual footed domino circuit stage, according to an embodiment of the present invention.

Dual domino circuit 1300 (FIG. 13) is latched to ameliorate the effects of leakage and noise for DC and low frequency operations. FIG. 19A depicts a substantially similar, yet unlatched dual domino circuit 1900, suitable for low voltage (e.g., ultra-low Vmin) operation, according to an embodiment of the present invention. FIG. 19B also depicts exemplary dual footed domino circuit 1900, according to an embodiment of the present invention. In FIG. 19B, for simplicity in describing exemplary embodiments below, unlatched dual footed domino circuit 1900 (as described with reference to FIG. 19A) is depicted in a simplified symbolism as a logic unit having the three inputs 'a', 'N-trigger' and 'P-trigger' and four clock marks, clock NC for precharge, clock PC for pre-discharge, and N and P foot cutoffs NF and PF.

Exemplary Low Voltage Dual Footed Domino Chain and Delay Chain

Figures 20A, 20B:
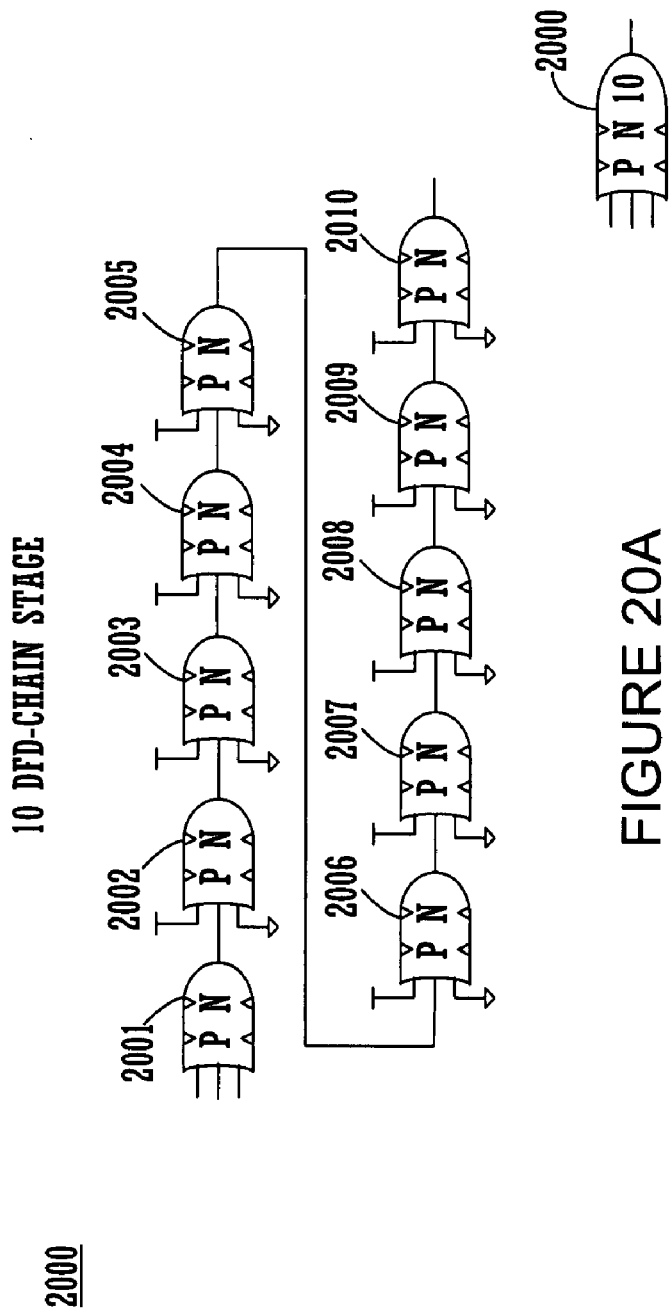
FIGS. 20A and 20B depict a diagram and a representation of an exemplary chain of unlatched dual footed domino circuits, according to an embodiment of the present invention.

FIG. 20A depicts an exemplary chain 2000 of ten unlatched dual footed domino circuits 2001-2010, according to an embodiment of the present invention. Other numbers (e.g., numbers beside 10) of unlatched dual footed domino circuits can be so chained. In the present embodiment, the ten unlatched domino circuits 2001-2010, all of them substantially identical to the domino circuit 1900 (FIGS. 19A-19B), are effectively connected together in a simple series configuration to form chain 2000. Unlatched dual domino chain is substantially similar in structure and function to the dual domino chains to that of dual domino chain 1400 (FIGS. 14A-14B).

FIG. 20B also depicts exemplary chain 2000 of dual-domino circuits, according to an embodiment of the present invention. In FIG. 20B, for simplicity in describing these exemplary embodiments, unlatched dual domino circuit chain 2000 (as described with reference to FIG. 20A) is depicted in a simplified symbolism as a ten unit (e.g., series) logic element having the three inputs 'a', the 'N-trigger' and 'P-trigger' and four clock marks for precharge, pre-discharge, and N and P foot cutoffs.

FIG. 21A depicts an exemplary delay chain 2100, according to an embodiment of the present invention. In one embodiment, delay chain 2100 comprises a series of stacked inverters 2101-2115, as described above in Section I (e.g., delay chain 325 of stacked inverters 371-388; FIG. 3). While in the present implementation fifteen stacked inverters are used, delay chain 2100 can also be implemented using other numbers of stacked inverters or other delay elements. FIG. 21B also depicts delay chain 2100, according to an embodiment of the present invention. In FIG. 21B, for simplicity in describing exemplary embodiments below, delay chain 2100 (as described with reference to FIG. 20A) is depicted in a simplified symbolism as a fifteen unit (e.g., series) inverter element.

Exemplary Trigger Circuit and Signals

Figure 22A:
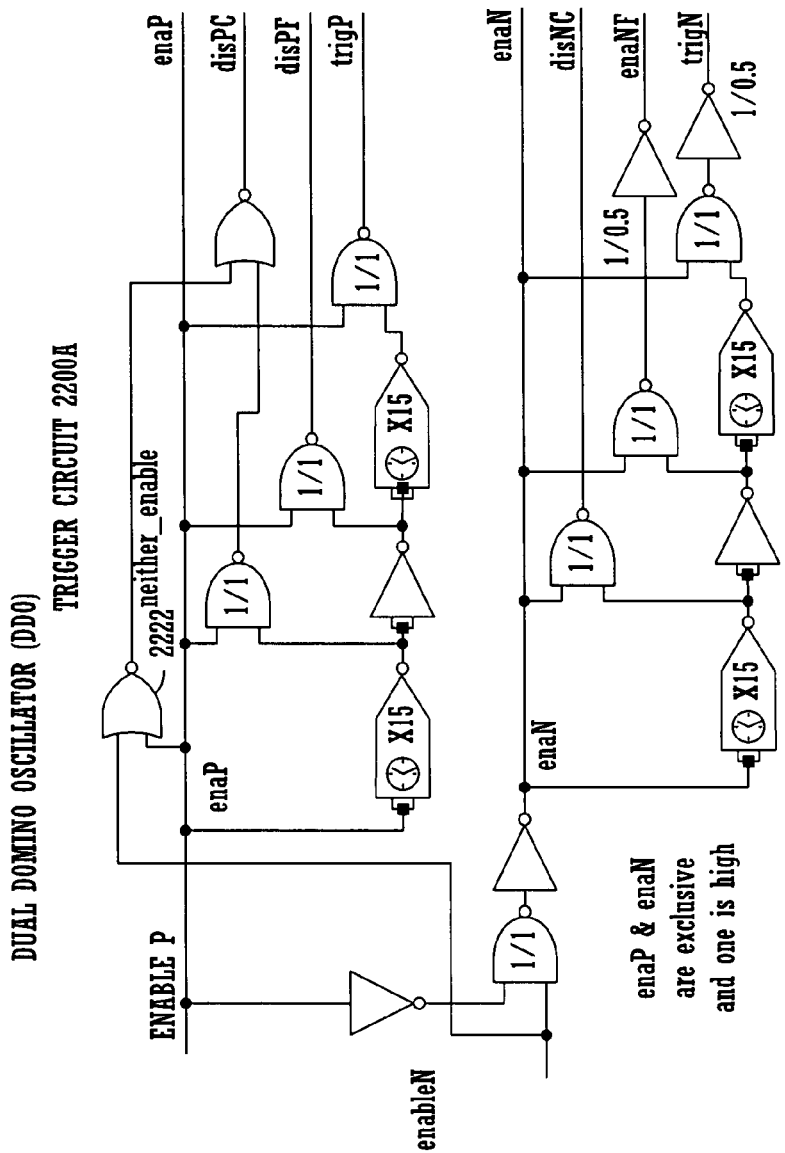
FIGS. 22A and 22B respectively depict a trigger circuit and signals, according to an embodiment of the present invention.
Figure 22B:
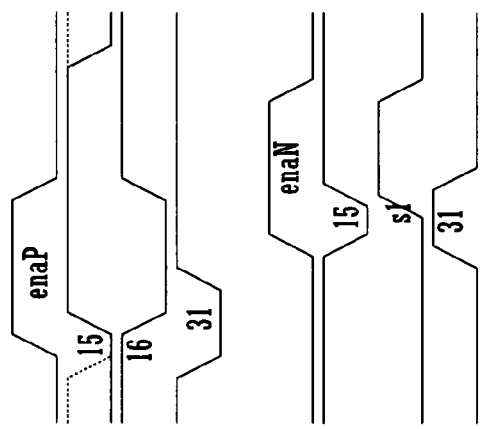

FIG. 22A depicts an exemplary trigger circuit 2200B for a dual dynamic ring oscillator circuit, according to an embodiment of the present invention. FIG. 22B depicts exemplary signals 2200B generated with trigger circuit 2200A, according to an embodiment of the present invention. For clarity and brevity, FIGS. 22A and 22B are described together. In one embodiment, the delay chains discussed in relation to trigger circuit 2200A comprise stacked inverters substantially similar to those described with reference to FIGS. 21A and 21B above. Signals 2200B comprises an initialization timing diagram for an unlatched embodiment of the dual dynamic ring circuit described above (e.g., dual domino ring circuit 1700; FIG. 17), suitable for operation at low voltages.

The operation of trigger circuit 2200A and signals 2200B are substantially similar to that of trigger circuit 1600A and signals 1600B (FIG. 16A, 16B). However, the operation of trigger circuit 2200A and signals 2200B differ from trigger circuit 1600A and signals 1600B in order to maintain a pre-discharge state when the dual dynamic ring oscillator is not oscillating. The nodes of the five state drivers comprising its dual domino circuits and chain stages are effectively thus kept from drifting. Thus, when no logic and control signals are driving the dual dynamic ring oscillator, a pre-discharge device is turned on to push the device into a stable pre-discharge state. As the dual domino circuit components are effectively unlatched, gate 2222 provides a 'neither_enable' output.

Capacitive Loading Factors Related to Dual Domino Ring Oscillators

The dual domino circuits and chains (e.g., dual domino circuit 1300, chain 1400; FIGS. 13A-13B, 14A-14B, respectively) drive the same, substantially (e.g., effectively) capacitive load. Thus, the various dynamic stages of the dual domino ring oscillators (e.g., dual domino ring circuit 1700; FIG. 17) described herein display inherent capacitive attributes (e.g., capacitance) as the respective dynamic stages operationally swing. Such inherent capacitance is swung by the constituent NFETs and PFETs of the constituent dual domino stages thereof. Thus, the substantially capacitive load the dual domino ring oscillator works to drive is effectively shared by the NFETs and PFETs comprising its stages.

Similarly, the dual domino circuits and chain stages comprising such dual domino ring oscillators share common buffer stages, as well. In on embodiment, the switching point selected for the buffer stages is half the supply voltage, e.g., Vdd/2. Advantageously therefore, the respective frequency related contributions of the N-domino circuit and chain stage components and the P-domino circuit and chain stage components uniquely differ by the relative strength of the constituent NFETs and PFETs.

High Precision Relative Comparison of Relative N and P Strengths

Figure 23A:
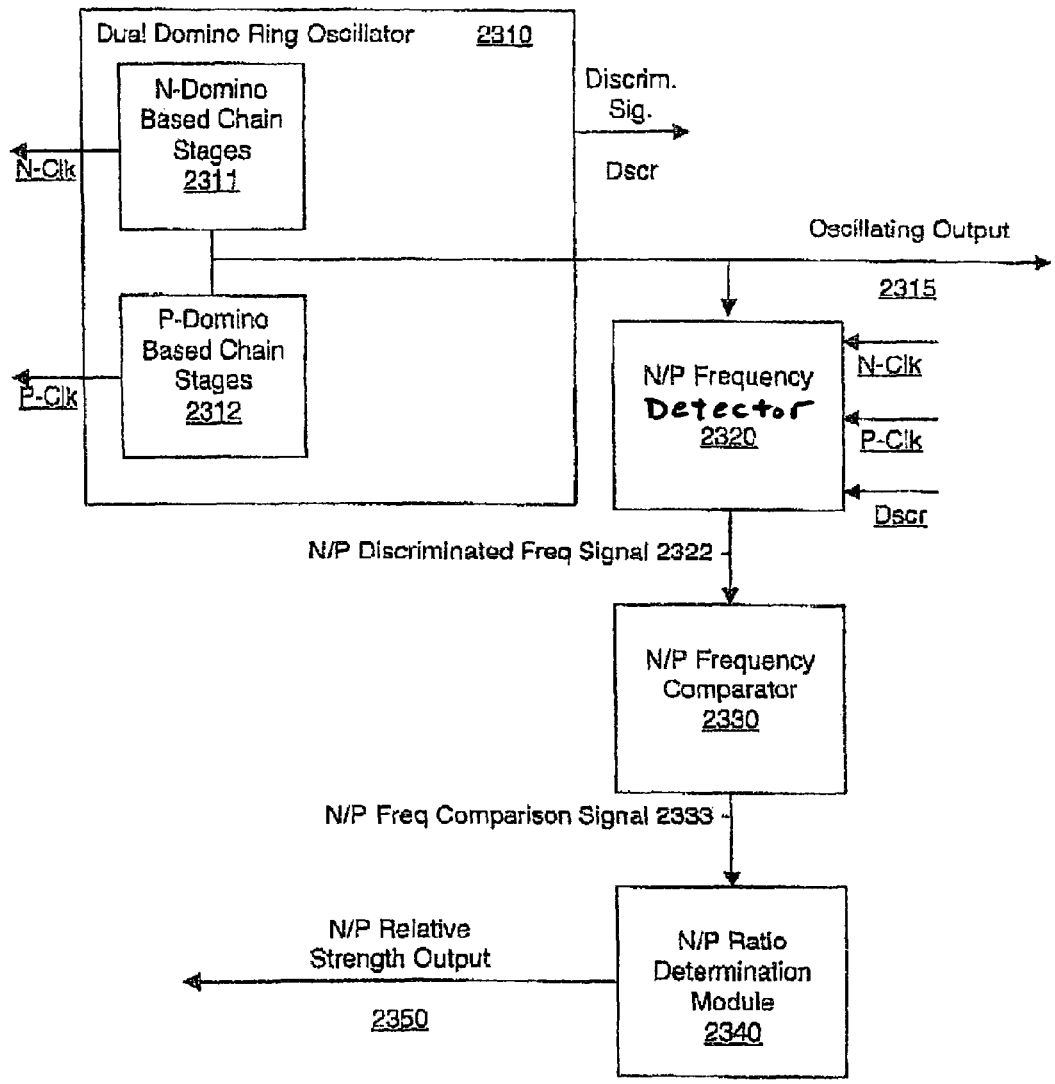
FIG. 23A depicts an exemplary system for effectively determining the relative strengths of constituent P-type and N-type devices accurately and/or with high precision, according to an embodiment of the present invention.
Figure 23B:
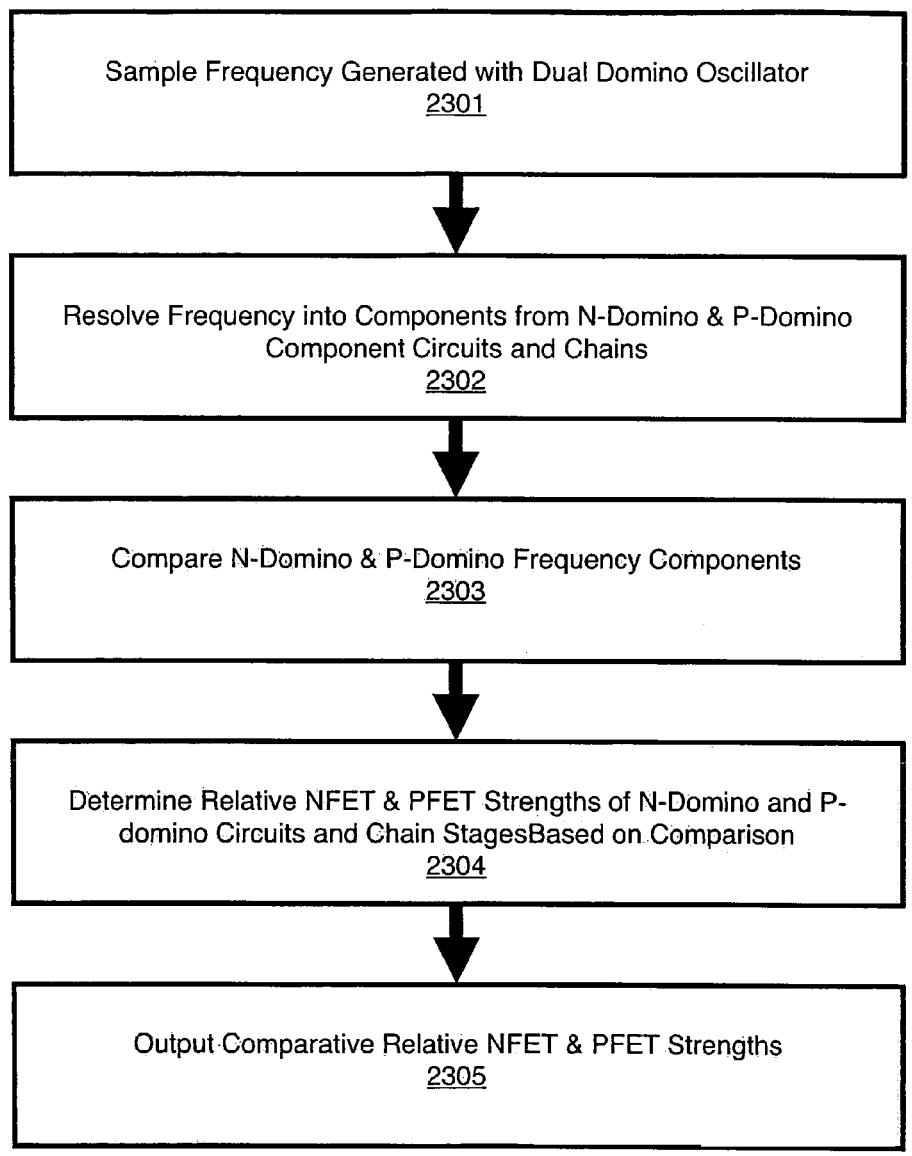
FIG. 23B is a flowchart of a process for effectively determining the relative strengths of constituent P-type and N-type devices accurately and/or with high precision, according to an embodiment of the present invention.

The dual domino ring oscillator described herein (e.g., dual domino ring oscillator 1700; FIG. 17) thus effectuates a highly precise comparison of the relative strengths of its constituent NFET and PFET strengths. FIG. 23A depicts an exemplary system 2300 for determining the relative strengths of N-based and P-based components of a dual domino ring oscillator. FIG. 23B is a flowchart of a process 2300B for effectively determining the relative strengths of constituent P-type and N-type devices with high precision and accuracy, according to an embodiment of the present invention. For clarity and brevity, FIGS. 23A and 23B are described together. Substantively, system 2300A and process 2300B respectively function in a substantially similar manner as does the exemplary relative P/N strength determination system and process described in Section I above. (e.g., system 1200A, process 1200B; FIG. 12A, 12B, respectively). However, in as much as the dual domino ring oscillators described herein (e.g., dual domino ring oscillator 1700; FIG. 17) share common components, they effectuate significantly higher accuracy and degree of precision in the determination (e.g., measurement, calculation, etc.) of the relative P/N strength ratios.

A dual domino ring oscillator 2310 comprises a pair of substantially complementary N-domino circuit based chain stages 2311 and P-domino circuit based chain stages 2312. The output of the N-domino circuit based chain stages 2311 is coupled with the output of the P-domino circuit based chain stages 2312 to generate an oscillating output 2315 for dual domino oscillator 2310. The frequencies (e.g. N-domino mode and P-domino mode) of the oscillating output 2315 is related to the relative strengths of the NFET and PFET components of the N-domino based circuits of chain stages 2311 and the P-domino based circuits of chain stages 2312. Thus, dual domino ring oscillating output 2315 has an NFET based frequency component and a PFET based frequency component, each substantially contributed by the N-domino circuit based chain stages 2311 and the P-domino circuit based chain stages 2312, respectively.

Process 2300B begins with block 2301, wherein a frequency generated with an dual domino oscillator 2310 is sampled, e.g., at an output thereof (e.g., output 2315). In block 2302, N-based and P-based frequency discrimination is performed. Frequency components of oscillating output 2315 are resolved into those provided by predominantly the N-domino circuit based chain stages 2311 and those contributed by predominantly the P-domino circuit based chain stages 2312. An NFET/PFET (N/P) frequency detector 2320 samples oscillating output 2315 and discriminates between its (e.g., resolves the) frequency components that are contributed (e.g., generated) by the N-domino circuit based chain stages 2311 and the P-domino circuit based chain stages 2312, respectively. In one embodiment, N/P frequency detector 2320 takes a discriminating signal Dscr from oscillating module 2310, which allows it to discriminate between the frequency components respectively contributed by the N-domino circuit based chain stages 2311 and the P-domino circuit based chain stages 2312, respectively, in generating dual domino ring oscillator output 2315.

In one embodiment, discriminating signal Dscr comprises signals enaP and enaN, respectively from the trigger circuit 2200A and/or another signal that allows it to resolve frequency components of oscillating output 2315 according to their source in either the N-domino circuit based chain stages 2311 and the P-domino circuit based chain stages 2312.

Upon discriminating between the sources of frequency components of oscillating output 2315, N/P frequency detector 2320 generates a corresponding N/P discriminated frequency signal 2322, which is input to N/P frequency comparator 2330. In block 2330, the frequency components respectively contributed by the N-domino circuit based chain stages 2311 and the P-domino circuit based chain stages 2312, are compared. N/P frequency comparator 2330 compares the discriminated (e.g., resolved) the N-domino circuit and chain stages 2311 based and the P-domino circuit and chain stages 2312 based frequency components of dual domino oscillator output 2315. Based on its comparison, N/P frequency comparator 2330 generates a corresponding, highly accurate and high precision N/P frequency comparison signal 2333.

In block 2340, the results of the comparison of frequency components of dual domino ring oscillator 2310 are used to determine the relative NFET/PFET strengths therein. N/P frequency comparison signal 2333 is input to N/P ratio determination module 2340. N/P ratio determination module 2340 determines (e.g., calculates, applies a process, an algorithm, etc., decides, ascertains, etc.) the relative NFET/PFET strengths of the sources (e.g., N-domino circuit based chain stages 2311 and P-domino based chain stages 2312) of oscillating output 2315. The relative frequency content of oscillating output 2315 is examined and the relative strength of their dynamic sources, N-domino circuit based chain stages 2311 and/or P-domino based chain stages 2312, e.g., either N-type or P-type, is deduced or induced there from.

Upon determining the relative NFET/PFET strengths, N/P ratio determination module 2340 outputs a corresponding N/P relative strength output signal 2350. In block 2305, the relative NFET/PFET strengths are output, completing process 2300B. Process 2300B can be performed with fewer steps. For instance, where the process comprises a function, e.g., inherent, in the operation of a system in which the oscillator is disposed, embedded, etc., in one embodiment, sampling of the frequency is obviated. Similarly, where the process is performed with a system functional to determine its own inherent relative N-based/P-based strength, in one embodiment outputting is obviated. System 2300A and process 2300B can be performed with, for instance, an up/down counter. During switching back and forth between N-based and P-based operation while dual domino ring circuits are oscillating, the frequency differences will vary according to the relative strength of the various N-based and P-based components. Where for instance the P-based strength is very close to the N-based strength, the differences in their respective contributions to oscillating output 2315 will be minimal, e.g., close to zero. On the other hand, where their relative N-based and P-based strengths vary, the differences in their frequency contributions will depart from zero.

System 2300A and process 2300B function with both DC/low frequency circuits and low voltage circuits, e.g., latched and unlatched circuits, as described above. Conventionally, analog circuits are typically used for determining relative N/P strength. However, typical analog circuits may not operate efficiently in at very low voltage applications, although determining the relative N/P strength therein is desirable. Advantageously, the circuits described herein operate efficiently at voltages low enough to be useful in applications where conventional analog N/P strength determination techniques may be inefficient. The circuits described above that function without latching (e.g., unlatched dual domino circuits 1900, 2000, 1700; FIGS. 19A-19B, 20A-20B, and 17, respectively) and thus operate at very low voltages (e.g., ultra-low Vmin operation). Thus, they provide the benefit of allowing determination of their relative N/P strengths without resort to conventional analog and digital circuits.

In summary, the exemplary embodiments described above include circuits, systems and methods relating to a dynamic dual domino ring oscillator. A dynamic dual domino oscillating ring circuit has multiple non-inverting dual domino circuits, each having a signal input, N and P-domino triggers, precharge and pre-discharge, N and P-domino cutoffs and an output inverter. A number of the dual domino circuits are coupled in series, the output of one feeding the input of the next, to form a dual domino chain, which form stages of the dual domino ring. A number of the stages are coupled in series, the output of one feeding the input of the next, to form the ring. The first dual domino circuit of the chain receives a signal input and the N and P triggers for the chain. Within the ring, the output of each stage feeds the input signal to the next stage and is fed back to clock an earlier stage to allow the ring to oscillate.

Embodiments of the present invention, circuits, systems and methods relating to a dual domino ring oscillator, are thus described. While the present invention has been described in particular embodiments, it should be appreciated that the present invention should not be construed as limited by such embodiments, but rather construed according to the following claims.

What is claimed is:

1. An oscillating ring circuit, comprising:
a plurality of non-inverting five state dual domino driving stages, each comprising an N-dynamic stage and a P-dynamic stage complementary thereto and having a signal input, an N-trigger input, a P-trigger input, a precharge state clock, a pre-discharge state clock, an N-cutoff clock, a P-cutoff clock and an output inverter; and
a plurality of non-inverting stages, each comprising a number of said non-inverting five state dual domino driving stages coupled to form a chain wherein a first non-inverting stage of the chain receives a logic signal input, a single N-trigger input and a P-trigger input for said chain, wherein an output of each non-inverting stage is a signal input of a next non-inverting stage in said chain, wherein said plurality of said non-inverting stages is configured as a non-inverting dual domino ring wherein an output of each non-inverting stage of said plurality of non-inverting stages comprises an input signal to a next non-inverting stage of said plurality of non-inverting stages and is further fed back to clock an earlier non-inverting stage to allow oscillation in said non-inverting dual domino ring.

2. The circuit as recited in claim 1 wherein each of said non-inverting stages evaluates on the basis of its respective input.

3. The circuit as recited in claim 1 wherein, upon said oscillation traversing said non-inverting dual domino ring to a last non-inverting stage thereof, one or more of said precharge state clock and said pre-discharge state clock corresponding to said first non-inverting stage has reset and responsive thereto said first non-inverting stage being ready to evaluate upon receiving an output of said last non-inverting stage, wherein said output of said last non-inverting stage resulting from said last non-inverting stage evaluating on the basis of said oscillation.

4. The circuit as recited in claim 1 wherein, prior to said oscillation traversing said non-inverting dual domino ring to a particular non-inverting stage, one or more of said pre-charge state clock and said pre-discharge state clock corresponding to said particular non-inverting stage being reset to a ready-to-evaluate condition to further propagate said oscillation.

5. The circuit as recited in claim 1 wherein non-inverting states of said plurality of non-inverting five state dual domino driving stages comprise:
a precharge state corresponding to said N-dynamic stage;
an evaluate state corresponding to said N-dynamic stage;
a pre-discharge state corresponding to said P-dynamic stage;
an evaluate state corresponding to said P-dynamic stage; and
a high impedance state wherein a corresponding non-inverting five state dual domino driving stage is substantially inactive.

6. The circuit as recited in claim 1 wherein said N-dynamic stage and said P-dynamic stage each effectively drive said output inverter independently.

7. The circuit as recited in claim 1 wherein each of said plurality of non-inverting five state dual domino driving stages further comprises a latch.

8. The circuit as recited in claim 7 wherein said latch comprises: an NFET based half latch; and a PFET based half latch for respectively jamb latching said N-dynamic stage and said P-dynamic stage.

9. The circuit as recited in claim 8 wherein said half latches comprise a series of three or more active devices, said active devices gated in parallel together, wherein said three or more active devices are gated with an output of said output inverter.

10. The circuit as recited in claim 1 wherein an output of each chain comprises an output of a last non-inverting stage in said chain.

11. The circuit as recited in claim 1 wherein each of said precharge state clock, said pre-discharge state clock, said N-cutoff clock and said P-cutoff clock are fed in parallel to each non-inverting stage of said chain.

12. The circuit as recited in claim 1 wherein one or more of said N-trigger input and said P-trigger input to a first non-inverting stage in said chain activates said chain, and wherein respective N and P trigger inputs to subsequent non-inverting stages of said chain are inactive.

13. The circuit as recited in claim 1 wherein one or more of said N-trigger input and said P-trigger input to one of said plurality of non-inverting stages activates said non-inverting dual domino ring to oscillate and wherein N-trigger inputs and P-trigger inputs of other non-inverting stages of said non-inverting dual domino ring are inactive.

14. The circuit as recited in claim 1, further comprising a pulse generator coupled to one non-inverting stage of said non-inverting dual domino ring for providing an N-trigger input and a P-trigger input thereto, wherein upon said one non-inverting stage being in a ready-to-evaluate state and a logic signal input present its signal input, said oscillation commences upon receiving said N-trigger input and said P-trigger input.

15. The circuit as recited in claim 14 wherein said pulse generator comprises a plurality of stacked inverters and a plurality of gates.

16. A system for determining relative strengths of N-type and P-type devices of a circuit, said system comprising:
- a dual domino oscillator comprising N-domino circuit stages and chain stages and P-domino circuit stages and chain stages, wherein said dual domino oscillator generates an output with a frequency dependent on characteristics generated by said N-domino circuit stages and said P-domino circuit stages;
- a detector coupled to said output for discriminating between generated characteristics of said N-domino circuit stages and said P-domino circuit stages and generating a discriminating signal corresponding to said discriminating;
- a comparator coupled to said detector for comparing said generated characteristics based on said discriminating signal and generating a corresponding comparison signal; and
- a determinator coupled to said comparator for determining said relative strengths of N-type and P-type devices of said dual domino oscillator based on said comparison signal.

17. The system as recited in claim 16 wherein said dual domino oscillator comprises:
- a plurality of non-inverting dual domino circuits.

18. The system as recited in claim 17 wherein each non-inverting dual domino circuit comprises a five state dual domino driving stage, wherein each of said five state dual domino driving stages comprises:
- an N-dynamic stage;
- a P-dynamic stage complementary thereto;
- a signal input;
- an N-trigger input;
- a P-trigger input;
- a precharge state clock;
- a predischarge state clock;
- an N-cutoff clock;
- a P-cutoff clock; and
- an output inverter.

19. The system as recited in claim 18 wherein said dual domino oscillator comprises a plurality of non-inverting stages each comprising a number of said non-inverting dual domino circuits coupled in series to form a chain wherein a first non-inverting stage of said chain receives a logic signal input, a single N-trigger input and a P-trigger input for said chain, wherein an output of each said non-inverting stage is an input to a next non-inverting stage in said chain.

20. The system as recited in claim 18 wherein said dual domino oscillator comprises:
- a plurality of said non-inverting stages to form a chain wherein an output of each non-inverting stage is an input signal to a next non-inverting stage and is further fed back to clock an earlier stage to allow oscillation in said dual domino oscillator.

21. The system as recited in claim 19 wherein said domino circuits comprising said plurality of non-inverting stages evaluate on the basis of said signal input, wherein upon said oscillation traversing said dual domino oscillator to a last non-inverting stage in said chain, one or more of the precharge state clock and pre-discharge state clock corresponding to a first non-inverting stage has been reset, wherein said first non-inverting stage being ready to evaluate upon receiving an output of said last non-inverting stage.

22. The system as recited in claim 21 wherein said output of said last non-inverting stage results from said last non-inverting stage evaluating on the basis of said oscillation and wherein prior to said oscillation traversing said dual domino oscillator to a particular non-inverting stage, one or more of a precharge state clock and a pre-discharge state clock corresponding to said particular non-inverting stage being reset to a ready-to-evaluate condition to further propagate said oscillation.

23. A method for determining relative strengths of N-type and P-type devices of a dual domino ring oscillator, said method comprising:
- resolving a frequency of operation of said dual domino ring oscillator into N-based frequency components and P-based frequency components respectively contributed by said N-type and said P-type devices wherein said N-type and said P-type devices respectively predominate in N-domino circuit stages and P-domino circuit stages of said dual domino ring oscillator;
- comparing said N-based frequency components and said P-based frequency components; and
- based on said comparing, determining said relative strengths of said N-type and said P-type devices.

24. The method as recited in claim 23 further comprising: sampling said N-based and P-based frequency components.

25. The method as recited in claim 23 further comprising: generating an output based on said determining.

26. A dual dynamic ring oscillator comprising:
- a five state dual domino driver stage comprising:
  - a plurality of N-domino devices;
  - a plurality of P-domino devices coupled to said plurality of N-domino devices and functionally complementary thereto; and
  - an output inverter driven sequentially by said plurality of N-domino devices and said plurality of P-domino devices, wherein states of said five state dual domino driver stage comprise:
    - a precharge state corresponding to said plurality of N-domino devices;
    - first evaluate state corresponding to said plurality of N-domino devices;
    - a pre-discharge state corresponding to said plurality of P-domino devices;
    - second evaluate state corresponding to said plurality of P-domino devices; and
    - a high impedance state in which said five state dual domino driver stage is relatively inactive.

27. The dual dynamic ring oscillator as recited in claim 26 further comprising:
- a non-inverting dual domino chain comprising a plurality of non-inverting stages, wherein each non-inverting stage comprises a plurality of said five state dual domino driver stages coupled in series to form said chain, wherein a first non-inverting stage of said chain receives a logic signal input, a single N-trigger input and a P-trigger input for said chain.

28. The dual dynamic ring oscillator as recited in claim 27 wherein an output of each of said plurality of non-inverting stages is input to a next non-inverting stage in said chain, wherein said plurality of non-inverting stages is configured as a non-inverting dual domino ring, and wherein an output of each non-inverting stage is input to a next non-inverting stage and is further fed back to clock an earlier non-inverting stage to allow oscillation in said non-inverting dual domino ring.

* * * * *